US006411642B1

(12) United States Patent
Mazed

(10) Patent No.: US 6,411,642 B1
(45) Date of Patent: Jun. 25, 2002

(54) TECHNIQUES FOR FABRICATING AND PACKAGING MULTI-WAVELENGTH SEMICONDUCTOR LASER ARRAY DEVICES (CHIPS) AND THEIR APPLICATIONS IN SYSTEM ARCHITECTURES

(75) Inventor: Mohammad A. Mazed, Chino Hills, CA (US)

(73) Assignee: Quantum Devices, Inc., Yorba Linda, CA (US)

( * ) Notice: Subject to any disclaimer, the term of this patent is extended or adjusted under 35 U.S.C. 154(b) by 0 days.

(21) Appl. No.: 09/537,202

(22) Filed: Mar. 28, 2000

Related U.S. Application Data

(62) Division of application No. 09/031,496, filed on Feb. 26, 1998
(60) Provisional application No. 60/063,560, filed on Oct. 28, 1997, and provisional application No. 60/059,446, filed on Sep. 22, 1997.

(51) Int. Cl.[7] .................................................. H01S 3/08
(52) U.S. Cl. ........................ 372/103; 372/103; 372/102; 372/75; 372/43; 372/45; 372/64; 372/99; 372/94
(58) Field of Search .......................... 372/103, 75, 102, 372/64, 99, 95, 43, 45

(56) References Cited

U.S. PATENT DOCUMENTS

| 4,517,280 A | 5/1985 | Okamoto et al. ............ 430/321 |
| 4,748,132 A | 5/1988 | Fukuzawa et al. .......... 437/125 |
| 4,846,552 A | 7/1989 | Veldkamp et al. ....... 350/162.2 |

(List continued on next page.)

OTHER PUBLICATIONS

Howard, Richard E. et al., "Multilevel Resist for Lithography Below 100 nm," *IEE Transactions on Electron Devices*, vol. ED–28, No. 11, Nov. 1981, pp. 1378–1381.

Okai, Makoto, "Spectral Characteristics of Distributed Feedback Semiconductor Lasers and Their Improvements by Corrugation–Pitch–Modulated Structure," *J. Appl. Phys.*, vol. 75(1), Jan. 1, 1994, pp. 1–29.

Okai, M. et al., "Novel Method to Fabricate Corrugation for a λ/4–Shifted Distributed Feedback Laser Using a Grating Photomask," *Applied Physics Letter* 55(5), Jul. 31, 1989, pp. 415–417.

Pakulski, G. et al., "Fused Silica Masks for Printing Uniform and Phase Adjusted Gratings for Distributed Feedback Lasers," *Appl. Phys. Lett.* 62(3), Jan. 1993, pp. 222–224.

Pearton, S.J. et al., "ECR Plasma Etching of Chemically Vapour Deposited Diamond Thin Films," *Electronics Letters*, Apr. 23rd, 1992, vol. 28(9), pp. 822–836.

Tennant, D. et al., "Characterization of Near–Field Holography Grating Masks for Optoelectronics Fabricated by Electron Beam Lithography," *J. Va. Sci. Technol. B* 10(6), Nov./Dec. 1992, pp. 2530–2535.

(List continued on next page.)

*Primary Examiner*—Paul Ip
*Assistant Examiner*—Delma R. Flores Ruiz
(74) *Attorney, Agent, or Firm*—Townsend and Townsend and Crew LLP

(57) ABSTRACT

Phase masks which can be used to make both linear and curved gratings of single or multiple submicron pitches, with or without any abrupt quarter-wavelength shifts (or gradually varying finer phase shifts) simultaneously on the wafer/substrate. The phase masks are made using direct write electron or ion-beam lithography of two times the required submicron pitches of linear and curved gratings on commercially available π phase-shifting material on a quartz substrate and wet or dry etching of the π phase-shifting material. The phase masks can be used in connection with making multi-wavelength laser diode chips. The laser diodes have a ridge structure with metal shoulders on either side of the ridge. The laser diode chip, with different wavelength lasers, is bonded and interfaced to a novel microwave substrate that allows for high signal-to-noise ratio and low crosstalk. The substrate is packaged in a low loss rugged housing for WDM applications.

13 Claims, 20 Drawing Sheets

U.S. PATENT DOCUMENTS

| | | |
|---|---|---|
| 5,244,759 A | 9/1993 | Pierrat .......................... 430/5 |
| 5,260,152 A | 11/1993 | Shimizu et al. ................ 430/5 |
| 5,287,001 A | 2/1994 | Buchmann et al. ......... 257/719 |
| 5,357,536 A | 10/1994 | Andrews .................... 372/50 |
| 5,367,588 A | 11/1994 | Hill et al. ..................... 385/57 |
| 5,384,797 A | 1/1995 | Welch et al. ................. 372/23 |
| 5,413,884 A | 5/1995 | Koch et al. ................... 430/5 |
| 5,586,211 A | 12/1996 | Dumitrou et al. |
| 5,651,016 A | 7/1997 | Yu et al. ....................... 372/34 |
| 5,821,013 A | 10/1998 | Miller et al. |
| 5,851,701 A | 12/1998 | Rolson |
| 5,972,542 A | 10/1999 | Starodubov |
| 5,981,075 A * | 11/1999 | Ohmi et al. ................ 428/428 |

OTHER PUBLICATIONS

Zah, C.E. et al., 1.5$\mu$m Compressive–Strained Multiquantum–Well 20–Wavelength Distributed–Feedback Laser Arrays, *Electonics Letters*, vol. 28(9), Apr. 23 1992, pp. 824–826.

* cited by examiner

TECHNIQUES FOR FABRICATING AND PACKAGING MULTI-WAVELENGTH SEMICONDUCTOR LASER ARRAY DEVICES (CHIPS) AND THEIR APPLICATIONS IN SYSTEM ARCHITECTURES

CROSS-REFERENCE TO RELATED APPLICATIONS

This application is a division of application Ser. No. 09/031,496, filed Feb. 26, 1998, of Mohammad A. Mazed, entitled "TECHNIQUES FOR FABRICATING AND PACKAGING MULTI-WAVELENGTH SEMICONDUCTOR LASER ARRAY DEVICES (CHIPS) AND THEIR APPLICATIONS IN SYSTEM ARCHITECTURES," the disclosure of which is incorporated by reference in its entirety for all purposes, which claims priority from the following provisional applications, the disclosures of which are incorporated by reference in their entirety for all purposes:

Application Ser. No. 60/063,560, filed Oct. 28, 1997, of Mohammad A. Mazed, entitled "TECHNIQUES FOR FABRICATING AND PACKAGING MULTI-WAVELENGTH SEMICONDUCTOR LASER ARRAY DEVICES (CHIPS) AND THEIR APPLICATIONS IN SYSTEM ARCHITECTURES"; and Application Ser. No. 60/059,446, filed Sep. 22, 1997, of Mohammad A. Mazed, entitled "TECHNIQUES FOR FABRICATING AND PACKAGING MULTI-WAVELENGTH SEMICONDUCTOR LASER ARRAY DEVICES (CHIPS) AND THEIR APPLICATIONS IN SYSTEM ARCHITECTURES".

BACKGROUND OF THE INVENTION

This application relates generally to optical communications and more specifically to techniques for manufacturing and packaging multi-wavelength distributed feedback (DFB) semiconductor laser (laser diode) arrays. All patent documents and other publications referred to herein are incorporated by reference in their entirety for all purposes.

Everywhere around the world, the ways people connect—through voice, video, and data—are radically changing through rapid advances of communication (telephony and computing) technologies. These technologies may vary widely in applications, yet every technology shares a common need: an ever-increasing need for more and more speed and bandwidth from 10 Mbit/sec to 100 Gbit/sec and beyond. The need for increasing bandwidth is equally compelling both in wireless and fiber-optic transmission networks.

While wireless technologies deliver freedom to communicate without any wire, they may be limited to only low to moderate bandwidth applications at the present time. For high bandwidth applications (beyond 10 Gbit/s), wired fiber-optic technology appears to be the only cost-effective solution at this time. For over a century standard copper cable has been used for telecommunication, but fiber-optic (cylindrical conduits of glass) can transmit voice, video, and data 100 times faster than standard copper cable. Unfortunately, only a minute fraction of the capacity of fiber-optic technology has been realized as of today due to limitation of optical-to-electronic and vice versa conversion methods.

With the invention of the erbium-doped optical fiber amplifier, the need for optical-to-electronic conversion in the networks is minimized. Thus by maintaining signal in the optical format and utilizing a wavelength division multiplexed/demultiplexed technology (WDM/WDDM, or sometimes simply WDM)—multiple different wavelengths (moderate bit rate on separate and distinct wavelengths) over the same optical-fiber, a large aggregate bit rate can be achieved.

Allowing a uniform amplification across many wavelengths, it is possible to transmit more than 40 wavelength (assuming a 100 GHz or 0.8 nm wavelength separation with each wavelength operating at a bit rate of 2.5 Gbit/s to 10 Gbit/s). WDM systems that are being manufactured today utilize discrete wavelength-specific components (transmitters/multiplexers and filters/demultiplexers).

Current wavelength normalized and average WDM system price per wavelength is on the order of $60,000 for ultra long-distance (approx 600 km) telecommunication applications and on the order of $25,000 for short-distance (approx 60 km) telecommunications applications. As the price of WDM components drops and the cost of deploying WDM technology becomes economical, it becomes possible to deploy WDM technology in the metropolitan, local telephone, fiber-to-the-home, and data communication markets.

Linear and curved gratings are the key elements of many advanced active and passive opto-electronic devices, such as distributed feedback (DFB) lasers, distributed Bragg reflector (DBR) lasers, unstable resonator lasers with curved gratings, vertically focused lasers, and filters. These advanced devices play significant roles in the fiber-optic communication systems for telephony, and computing.

There are number of known techniques for fabricating gratings of the type required, but they are typically characterized by a number of disadvantages. For example, direct write electron beam lithography has the advantages of fine pitch control and the ability to produce quarter-wavelength or finer phase shifts and arbitrary shaped gratings. However, it is characterized by high equipment expense and low throughput, and subjects the wafers to potential material damage due to the impingement of the energetic electron beam. Other approaches using a binary phase mask have the advantages of high throughput, fine pitch control, and the ability to produce quarter-wavelength or finer phase shifts and arbitrary shaped gratings. However, they can be characterized by complex fabrication procedures, and are limited to grating pitches commensurate with the mask pitch (say 200 nm).

SUMMARY OF THE INVENTION

The present invention provides a robust process to manufacture phase masks which can be used to make both linear and curved gratings of single or multiple submicron pitches (including continuously varying pitches), with or without any abrupt quarter-wavelength shifts (or gradually varying finer phase shifts) simultaneously on the wafer/substrate. This allows practical commercial fabrication of multi-wavelength laser diode arrays (laser chips). The invention also provides techniques for fabricating durable and reliable laser chips, efficiently packaging them and interfacing them to laser driver chips. The laser chips can be made using standard semiconductor processes, although embodiments of the invention further enhance some of such process to provide improved manufacturability and laser chip reliability.

The present invention utilizes direct write electron or ion-beam lithography of two times the required submicron pitches of linear and curved gratings (with or without phase-shifted regions) on commercially available π phase-shifting material on a quartz substrate and wet or dry etching of the π phase-shifting material. Wet or dry etching of the π phase-shifting material produces an exact π phase shift which is necessary to produce a zero order nulled π phase-shifted phase mask. In an alternative embodiment, a π phase-shift mask is produced by direct writing on a quartz substrate and etching the quartz substrate to a very precise depth to cancel the zero order beams (transmitted and diffracted). The invention thus relaxes critical pitch dimensions for electron or ion-beam lithography fabrication of less than 200 nm pitch linear and/or curved gratings.

The present invention also provides an improved ridge laser structure having metal shoulders on either side of the laser's active region. The shoulders are formed over an insulating layer, but one of the shoulders is electrically connected by contact metal to the ridge waveguide semiconductor material.

The present invention also provides an improved technique for coupling the information-bearing signal to the laser chip with very high fidelity. This is achieved by designing a circuit that can carry multiple signals at very high frequencies (say 10 GHz) without interference (known as crosstalk) degradation. According to this aspect of the invention, metallized via holes connect metal structures above a substrate to a backside ground plane below the substrate. In one embodiment, the metal structures are ground lines interspersed with RF/DC transmission lines on the top surface of the substrate. The ground lines are perforated by the metallized vias. In another embodiment, the vias can be disposed in pairs distributed along the RF/DC transmission line, with one via in each pair on one side of the RF/DC transmission line and the other via in the pair on the other side. The metal structures in this case can be individual wire arches overlying the RF/DC transmission line and extending into the vias on either side.

A further understanding of the nature and advantages of the present invention may be realized by reference to the remaining portions of the specification and the drawings.

DESCRIPTION OF SPECIFIC EMBODIMENTS

1.0 Distributed Feedback (DFB) Laser Structural Overview

Figure 1A:
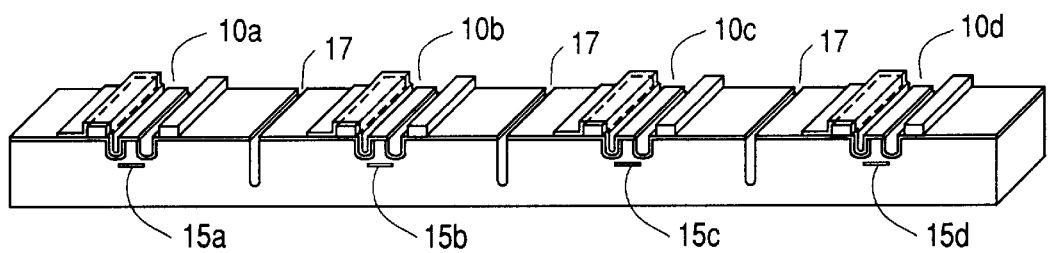
FIG. 1A shows a multi-wavelength distributed feedback (DFGB) ridge laser array according to a four-laser embodiment of the invention.
Figure 1B:
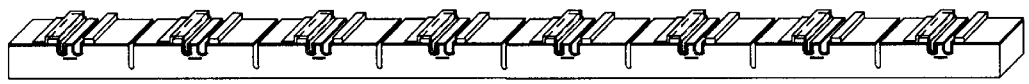
FIG. 1B shows an eight-laser embodiment.

FIG. 1A is a schematic view of a multi-wavelength distributed feedback (DFB) ridge laser diode array 10, according to an embodiment of the present invention. Laser array 10 is sometimes referred to as the laser chip. Laser chip 10 includes a plurality, in the shown specific embodiment four, of ridge laser diode elements, designated 10a, 10b, 10c, and 10d on a single substrate. Each ridge laser diode element, sometimes referred to simply as a laser, is configured to emit light at a different wavelength, the wavelengths being designated $\lambda_1$, $\lambda_2$, $\lambda_3$, and $\lambda_4$. The lasers have respective associated gratings 15a–15d, the respective pitches of which determine the lasers' respective wavelengths. As will be described below, the technology of the invention facilitates etching gratings of different pitches on the same substrate. The number of lasers can be smaller or larger (say 8, as shown in FIG. 1B).

Laser chip 10 is shown in a particular orientation that defines what are referred to as top and bottom; however, as will be described below, the laser chip is preferably inverted before being mounted on a substrate in a module so as to improve the heat transfer.

In the specific embodiment, the laser wavelengths are in the neighborhood of 1555 nm, for which many current fiber-optic communications modules and systems are configured. The wavelengths are spaced by approximately 3.2 nm, which corresponds to grating pitches spaced by approximately 0.5 nm. For example, an embodiment of the laser chip with grating pitches of 238.5 nm, 239.0 nm, 239.5 nm, and 240.0 nm provides operation at wavelengths of 1548.82 nm, 1552.02 nm, 1555.22 nm, and 1558.42 nm, respectively. It is also possible to have the wavelengths spaced by 0.8 nm or 1.6 nm.

The invention's ability to fabricate gratings of different pitches on the same chip translates to an important advantage, namely the ability to provide a multi-wavelength DFB laser chip. The chip can be operated with any one wavelength selected at a given time, or with all wavelengths transmitting simultaneously, depending on the application. It is noted that the ability to transmit multiple wavelengths simultaneously from a single chip makes it possible to reduce the cost of WDM systems.

It is further noted that the invention's ability to fabricate gratings of different pitches on the same chip also provides advantages in connection with the fabrication of individual laser diodes. The ability to have gratings of multiple pitches on the wafer before the wafer is scribed into chips allows a single wafer to be scribed into multi-wavelength laser array chips, or into single-laser chips, resulting in lasers with different wavelengths from the same wafer.

Undesirable optical, thermal, and electrical cross-talk among the lasers is minimized to some extent by physically separating the lasers by approximately 500 microns on the laser array chip and by forming isolation trenches 17 between adjacent lasers.

Figure 1C:
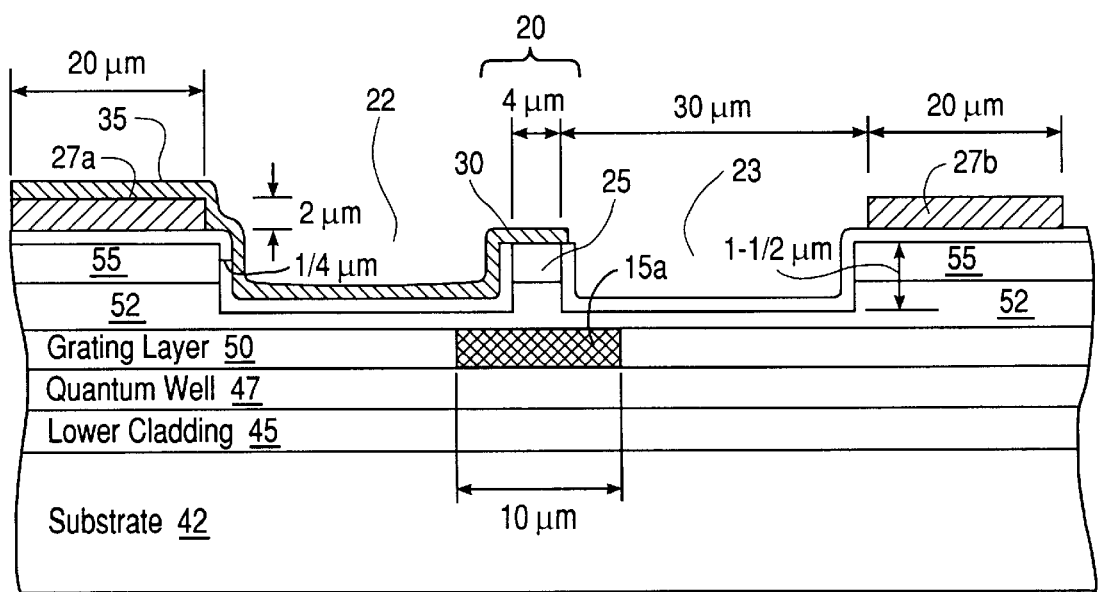
FIG. 1C is a more detailed view of one of the DFB ridge lasers in the array.

FIG. 1C is an enlarged view showing one of the lasers, say laser 10a. The laser's active region 20 is formed within a body of semiconductor material. The laser is referred to as a ridge laser because the body is formed with trenches 22 and 23 on either side of the active region 20 to define a ridge 25 overlying grating 15a. A pair of metal shoulders 27a and 27b are formed outboard of trenches 22 and 23. An upper layer of contact metal 30 (p+ contact) overlies the ridge while a lower (backside) layer of contact metal 32 (n+ contact) is deposited on the bottom of the chip. Contact metal 30 is continues downwardly through and out of trench 22, and overlies shoulder 27a to provide a bond pad 35. The figure also shows schematically the various layers of the laser and its active region, the layers include an n+ substrate 42, a lower cladding layer 45, an active (quantum well) layer 47, a grating layer 50, an upper cladding layer 52, and a p+ contact layer 55. Grating patterns are etched into select regions of the grating layer, and their respective pitches define the individual laser wavelengths. Grating 15a is shown as a hatched portion of grating layer 50.

Representative dimensions for a specific embodiment are provided for the purpose of illustration only in order to provide context for the detailed discussions below. Laser chip 10 is approximately 0.5 mm long (length of laser cavity) by 2.0 mm wide, so that the individual ridge laser diodes are spaced by 0.5 mm (500 microns). While these are macroscopic dimensions, the structures illustrated are microscopic. For example, ridge 25 is about 4 microns wide, trenches 22 and 23 are each about 30 microns wide, and shoulders 27a and 27b are each about 20 microns wide. The trenches 17 are about 1.5 microns deep and the shoulders are about 2 microns thick.

While the various layers of the chip extend over substantially the whole area of the chip, the grating pattern is formed over only a small area of the grating layer (say about 10 microns wide) and the active region of each laser underlies its respective ridge. The grating has features about 0.05 microns in depth and is disposed about 0.4 microns beneath the ridge and about 0.05 microns above the active layer. The active layer itself is about 1 micron thick.

The following sections in this specification describe various aspects of the technology embodied in laser array 10. In particular, the following description will include details of fabricating and using a phase mask, using the phase mask to make the grating, fabricating the laser chip with the gratings of multiple pitches to support multi-wavelength operation, providing isolation between channels, and packaging and incorporating the laser chip in a module.

2.0 Phase Mask for Making Grating

2.1 Comparison of Phase-Shift Mask and Binary Intensity Mask

A phase-shift mask, usually referred to as a phase mask, is used in connection with defining the grating pattern in layer 50 of the fabricated with twice the pitch of the desired grating features, thereby allowing finer gratings than would otherwise be possible. This can best be understood with reference to the following comparison between a standard binary intensity mask (BIM) and a phase mask. As will be described below, the invention uses the property of a net $\pi$ phase shift (based on scalar optics) allowing only symmetric m=+1 and m=−1 beams to interfere where the zero-order beams cancel, giving rise to a spatial frequency doubling.

Figure 2A:
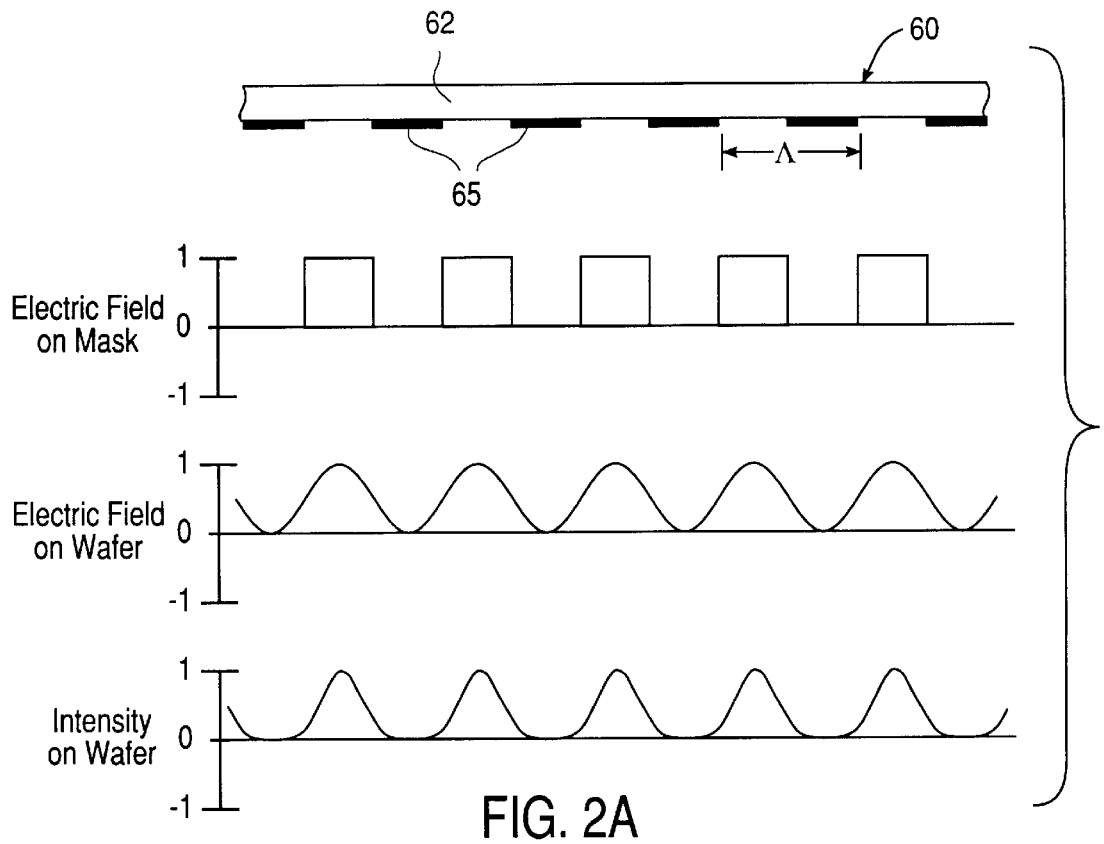
FIG. 2A shows the structure and operation of a binary intensity mask.

FIG. 2A shows, in four registered segments, the structure and operation of a binary intensity mask 60. The first segment of the figure shows mask 60, which includes a transparent substrate 62, such as quartz, on which are deposited regions of opaque material 65, such as chromium. The pattern of the opaque material defines the pattern to be replicated in a layer on a semiconductor device. The pattern is characterized by a pitch, or alternatively by a spatial frequency that is the reciprocal of the pitch.

The second segment of the figure is a plot showing the electric field at mask 60 as a function of distance along the mask surface. As can be seen, the electric field along he direction of mask 60 has alternating regions of maximum amplitude and zero amplitude corresponding to the transparent regions and opaque regions, respectively.

The third segment is a plot of the electric field on the wafer. Due to interference and other effects, the electric field on the wafer is generally sinusoidal about a positive offset, alternating between zero and a maximum amplitude, with a spatial frequency equal to the spatial frequency of the mask pattern.

The fourth segment is a plot of the resulting intensity on the wafer. The intensity on the wafer is given by the square of the electric field, which can be seen to have the same spatial frequency as that of the pattern on mask 60.

Figure 2B:
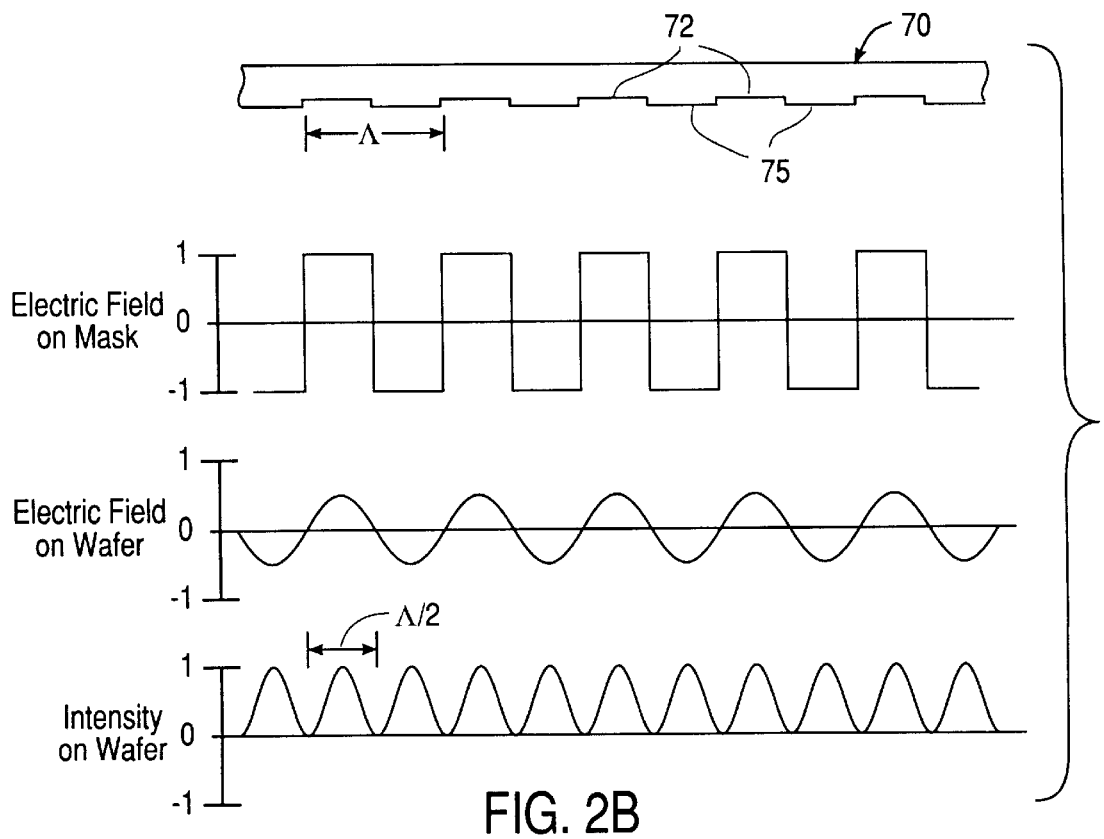
FIG. 2B shows the structure and operation of a π phase-shifted phase mask.

FIG. 2B shows, in its corresponding four registered segments, the structure and operation of a phase mask 70. Mask 70 is at least partially transparent over a portion of its surface, but includes alternating portions 72 and 75 representing an optical path difference through the mask. The pitch of these alternating portions is denoted $\Lambda$. In a particular embodiment, the phase shift is $\pi$ radians. Accordingly, mask 70 is referred to as a $\pi$ phase-shifted mask. Two embodiments of the mask will be described below: one (denoted 70P below) in which the mask comprises a substrate 77, and wherein regions 75 are defined by a separate layer, of predefined thickness, of phase-shifting material; and one (denoted 70Q below) in which the material is monolithic quartz.

The second segment of the figure is a plot showing the optical electric field at mask 70 as a function of distance along the mask surface. As can be seen, the electric field along the direction of mask 70 alternates about zero with a spatial frequency corresponding to the spatial frequency of the mask pattern (i.e., a pitch of $\Lambda$).

The third segment is a plot of the electric field on the wafer. Due to interference and other effects, the electric field on the wafer is generally sinusoidal, oscillating about zero with the same spatial frequency.

The fourth segment is a plot of the resulting intensity on the wafer. The intensity on the wafer is given by the square of the electric field, and since the electric field oscillates about zero, the intensity is periodic at twice the spatial frequency as that of the pattern on mask 70 (i.e., a pitch of $\Lambda/2$).

2.2 Fabrication of Phase Mask Using Phase-Shifting Material

FIGS. 3A–3G show the fabrication steps for a first method of making a zero-order nulled $\pi$ phase-shifted phase mask, designated 70P, using phase-shifting material. Blanks of such phase-shifting material are commercially available. A suitable material would be an embedded i-line/365 nm 6% transmission or 9% transmission phase-shift blank, available from DuPont Photomasks Inc.

Figure 3A:
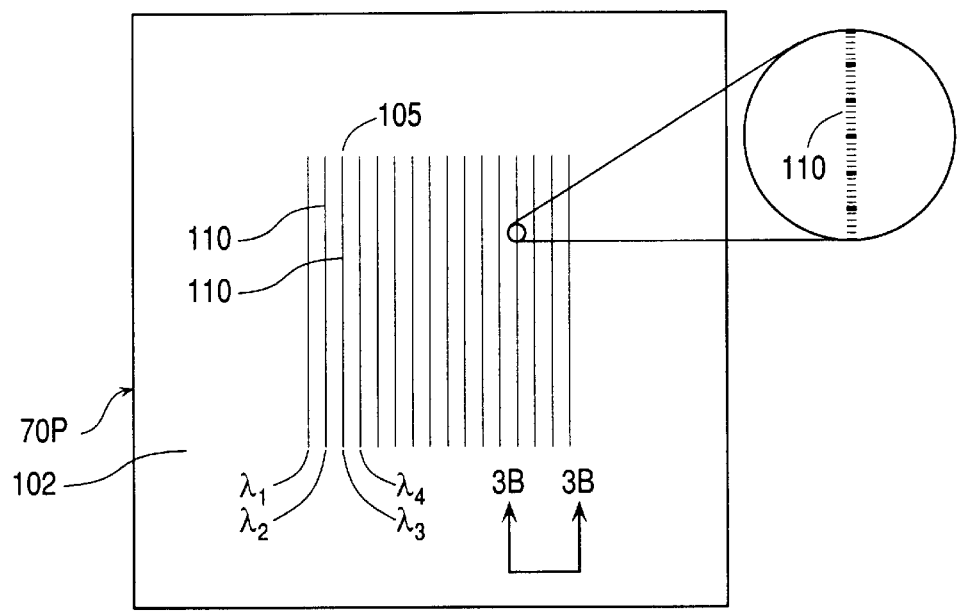
FIGS. 3A–3G show the fabrication steps for a first method of making a π phase-shifted phase mask.

FIG. 3A is a schematic top view of phase mask 70P. The mask, designed in the specific embodiment for use with two-inch wafers, has a generally opaque peripheral region 102 and a central region 105 containing the phase mask elements for exposing the grating patterns on the wafer. In this instance, only a quarter of the wafer would be exposed at a time; in other embodiments, the mask could be large enough to cover the whole wafer. The regions containing the grating patterns, designated 110, are referred to as the grating stripes. They are denoted schematically as solid lines since they are only a few microns wide (10 microns in a specific embodiment) but extend from one edge of central region 105 to the other. Also, as mentioned above, the gratings are on ½-mm centers (500 microns), which means that there would be on the order of 50 grating stripes on the portion of the mask rather than the smaller number shown. Each stripe's grating pattern extends perpendicular to the direction of the stripe, as shown in the magnified portion. For the particular embodiment, the grating patterns are in repeating sequences of four, corresponding to the four wavelengths $\lambda_1$, $\lambda_2$, $\lambda_3$, and $\lambda_4$. The magnified portion also shows, in highly stylized form, the fact that the grating patterns can be made to incorporate a phase-shifted region, such as a $\lambda/4$ phase-shifted region. Phase-shifted regions are shown schematically as being spaced at 0.5 mm, which corresponds to the length of the laser cavity (one such phase shifting region is centered in the cavity, as will be described in detail below).

Figure 3B:
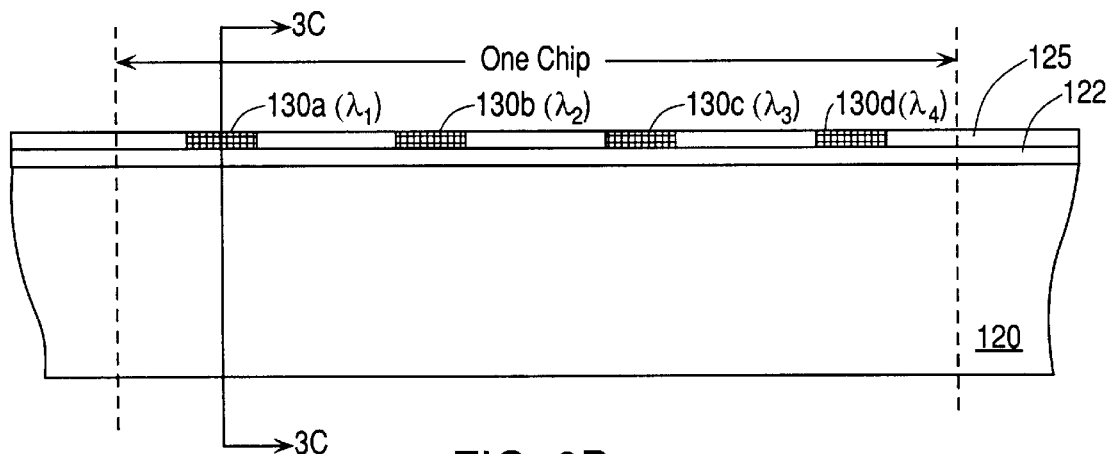

FIG. 3B is a sectional view of a $\pi$ phase-shift blank that includes a quartz substrate 120 and an overlying layer of phase-shifting be understood that FIG. 3A shows the finished phase mask while FIG. 3B shows an early stage in the fabrication.

FIG. 3B shows the phase-shift blank having been coated with a layer of light sensitive material (such as photoresist) 125 and the photoresist having been written directly using electron or ion beam lithography so as to expose regions 130a–130d, which will be used to define grating stripes 110 on the finished phase mask. The portion of FIG. 3B corresponds to a width on the phase mask that is slightly more than that of a single four-wavelength chip on the wafer that will be exposed using the phase mask. The exposed regions (drawn cross-hatched) are greatly exaggerated since they are only about 10 microns wide at a center separation of about ½ millimeter (500 microns). As such, it shows four exposed regions, corresponding to the four lasers that will constitute a four-laser chip.

Figure 3C:
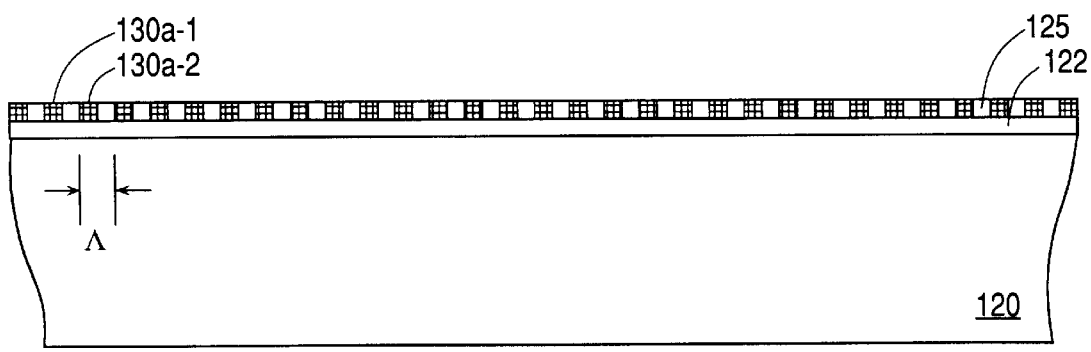

FIG. 3C shows a sectional view taken along line 3C—3C in FIG. 3B. The drawing shows the exposed portions of region 130a that will define the actual grating. These exposed portions are designated 130a-1, 130a-2, etc. This drawing is also not drawn to scale, since the features as seen from this angle are sub-micron (at twice the pitch of the gratings on the chip). The pitch of exposed portions is denoted $\Lambda$ as in FIG. 2B, which, as discussed above, corresponds to a pitch of $\Lambda/2$ on the exposed wafer.

One possible implementation of this process can use a single layer photoresist of 950K molecular weight 2% to 5% PMMA (200 nm–500 nm thick) with an overcoat of 10 nm aluminum metal on the polymethyl methyl acrylate (PMMA) to reduce surface electrical charging on the phase-shifting material due to the insulating nature of the $\pi$ phase-shifting material (on a 90 mil thick quartz substrate). Alternatively, a tri-layer photoresist comprising a 2% PMMA 200 nm top layer, an evaporated germanium or silicon 10 nm middle layer, and a 180° C. baked photoresist 200 nm bottom layer (180° C. baked photoresist spun on first) can be deposited on the $\pi$ phase-shifting material (on a 90 mil thick quartz). The concept of tri-layer photoresist was described in the article Howard et al., IEEE Transactions of Electron Devices ED-28 (11) 1981 pp 1378–1381.

The direct writing of the pattern can be performed in multiple passes with reduced electron or ion beam intensity. The desired pattern can be written on the photoresist by a multi-pass electron or ion beam lithography at 50 KV or 100 KV. The fuel exposure dose can be divided over many passes to reduce non-uniformity and stitching errors during the electron or ion-beam writing.

Figure 3D:
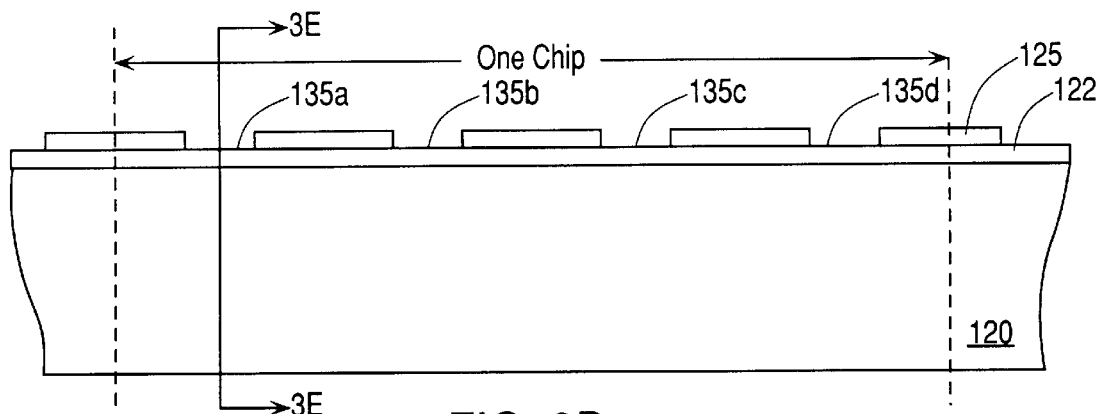
Figure 3E:

FIGS. 3D and 3E are sectional views showing the photoresist-coated phase-shifting material after development of the photoresist. As can be seen, the regions of photoresist exposed by the electron or ion beam have been removed by the development step, leaving bare regions 135a–135d of phase-shifting layer 122. These bare regions are segmented at the phase mask pitch as shown in FIG. 3E, and the individual segments are denoted 135a-1, 135a-2, etc.

In the case of the single layer PMMA, the aluminum layer can be etched in an aluminum etching solution first, then the PMMA is developed by 1:1 volume ratio of methyl isobutyl ketone:isopropanol, and finally rinsed with isopropanol and dried in nitrogen.

In the case of the tri-layer resist process, the PMMA is first developed in 1:1 volume ratio of methyl isobutyl ketone:isopropanol, rinsed with isopropanol and dried in nitrogen. The sample is then etched in deionized water to remove native oxide on the germanium layer, then the germanium or silicon is dry etched by low pressure reactive (or magnetically enhanced) ion etching in a pure $CF_4$ plasma. The hard baked 180° c. photoresist is etched by low pressure reactive (or magnetically enhanced) ion etching in pure $O_2$ plasma.

Figure 3F:
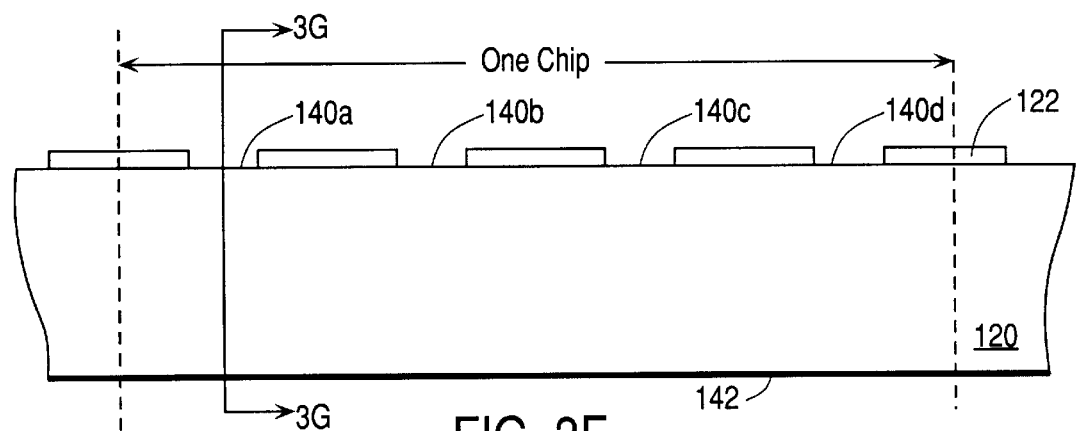
Figure 3G:
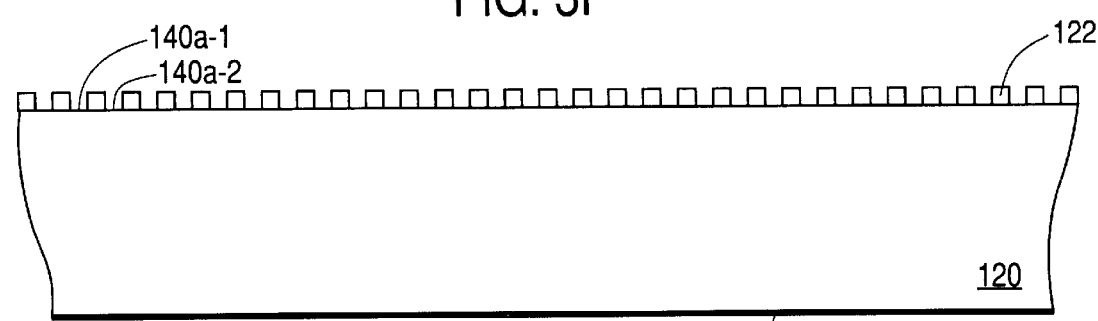

FIGS. 3F and 3G are sectional views showing the finished phase mask after etching bare regions 135a–135d of phase-shifting layer 122 to replicate the pattern in the phase-shifting material, leaving bare regions 140a–140d of substrate 120. These bare regions are segmented at the phase mask pitch as shown in FIG. 3G, and the individual segments of region 140a are denoted 140a-1, 140a-2, etc. The etching is preferably done by a process that etches the phase-shifting material down to the quartz substrate, but does not significantly etch the quarts substrate.

In the case of a single layer PMMA, the submicron pattern on the $\pi$ phase-shifting material can be wet etched utilizing diluted commercial chromium etchant. In the case of the tri-layer resist, the $\pi$ phase-shifting material can be etched by mid pressure reactive ion etching (or magnetically enhanced) in a $Cl_2$ (80%) and $O_2$ (20%) gas mixture plasma. Final removal of the 180° C. baked photoresist can be done by using a commercial photoresist stripper, high pressure reactive ion etching in pure $O_2$ gas plasma.

The phase mask is then subjected to final surface preparation and deposition of a backside antireflection coating 142.

If desired, chromium can be deposited over the portions of the phase mask other than the grating stripes, using standard deposition and liftoff techniques. This can be easily done after etching the grating patterns. If done after, the etched grating stripes must be covered with photoresist so that the deposited chromium can be lifted off the regions of the grating stripes. Note that where chromium etchant is used to etch the grating patterns in the phase-shifting material etching, it is generally not suitable to pattern the chromium by deposition and subsequent photolithography and etching, since chromium etchant will also etch the phase-shifting material.

2.3 Fabrication of Phase Mask Using Direct Etching

FIGS. 4A–4G show the fabrication steps for a second method of making a zero-order nulled π phase-shifted phase mask. This method differs from the first method described above in that the pattern for the grating is etched in a quartz blank rather than in phase-shifting material deposited on a quartz substrate. The quartz blank is originally chromium-plated (as are binary photomask blanks).

Figure 4A:
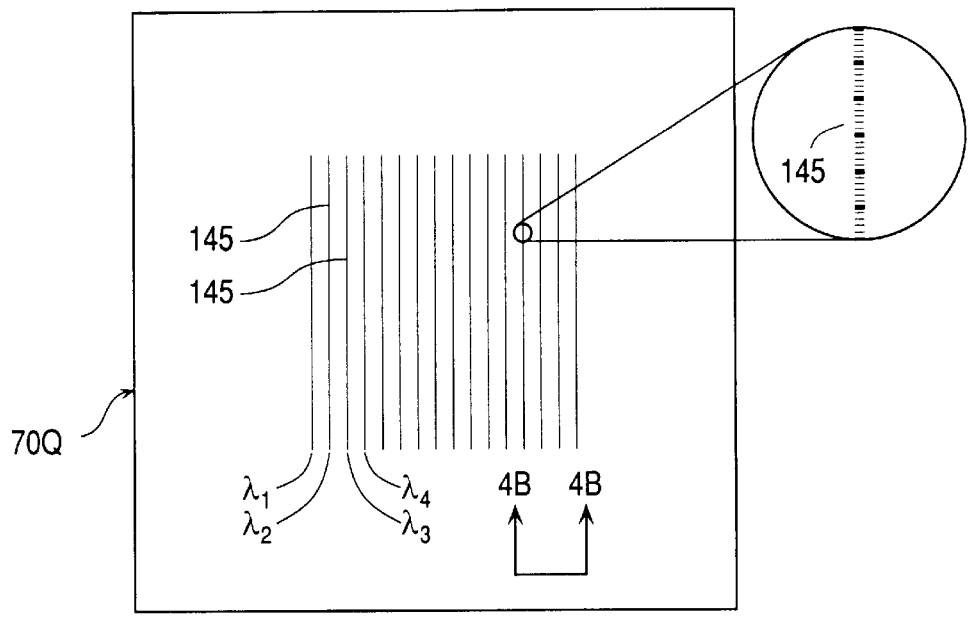
FIGS. 4A–4G show the fabrication steps for a second method of making a π phase-shifted phase mask.

FIG. 4A is a schematic top view of phase mask 70Q. The mask is primarily opaque (chromium coating) with grating stripes 145 disposed in a central region of the mask. As in the case of phase mask 70P, only a quarter of the wafer would be exposed at a time. Also, as above, the stripes are denoted schematically as solid lines, each stripe's grating pattern extends perpendicular to the direction of the stripe, as shown in the magnified portion, and the grating patterns are in repeating sequences of four, corresponding to the four wavelengths $\lambda_1$, $\lambda_2$, $\lambda_3$, and $\lambda_4$.

Figure 4B:
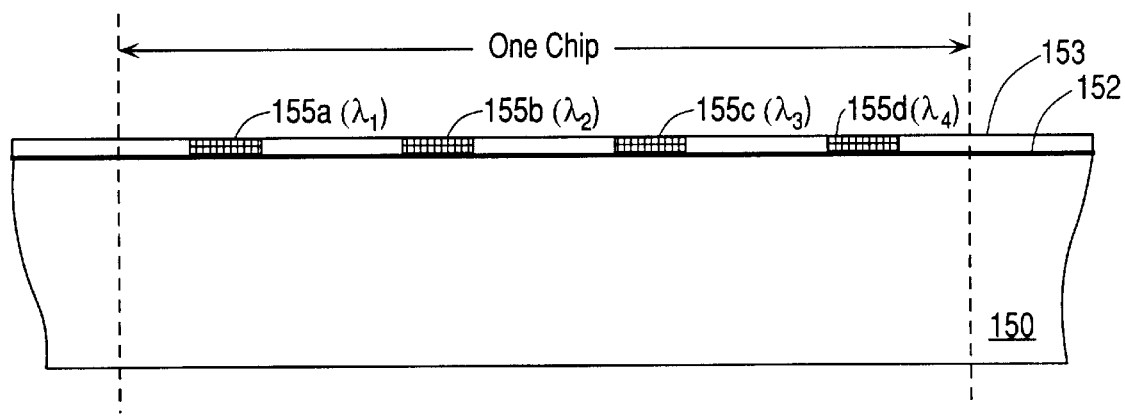

FIG. 4B is a sectional view of a portion of a chromium-plated quartz blank that includes a quartz plate 150 and an overlying layer of chromium 152. This view is taken along line 4B—4B of FIG. 4A (it should be understood that FIG. 4A shows the finished phase mask while FIG. 4B shows an early stage in the fabrication). FIG. 4B shows the blank having been coated with a layer of photoresist 153 and the photoresist having been written directly using electron or ion beam lithography so as to expose regions 155a–155d, which will be used to define grating stripes 145 on the finished phase mask. As in the case of mask 70P, the portion of FIG. 4B corresponds to a width on the phase mask that is slightly more than that of a single four-wavelength chip, the exposed regions (drawn cross-hatched) are greatly exaggerated, and shows four exposed regions, corresponding to the four lasers that will be on the finished chip.

The process begins with preparation of 950K molecular weight 5% PMMA (500 nm) on a 90 mil thick chromium-plated quartz plate (the 90 mil thickness was chosen because it does not bow significantly over time and temperature). Electron or ion-beam lithography can be utilized to direct write edge alignment cross marks and stripe opening (10 micron wide and approximately 10 mm long) at selected placed on the chromium-coated blank. The alignment cross marks and stripe openings can be wet etched using commercial chromium etchant. To obtain high contrast alignment cross marks for electron beam lithography, Cr and Au (5 nm/100 nm) can be evaporated on the selected areas of the alignment marks while carefully shadow masking the stripe opening area. The Cr and Au alignment marks can be lifted off and the chromium-coated blank rinsed with isopropanol and plasma ashed utilizing $O_2$ gas to remove any surface residue of photoresist.

Figure 4C:
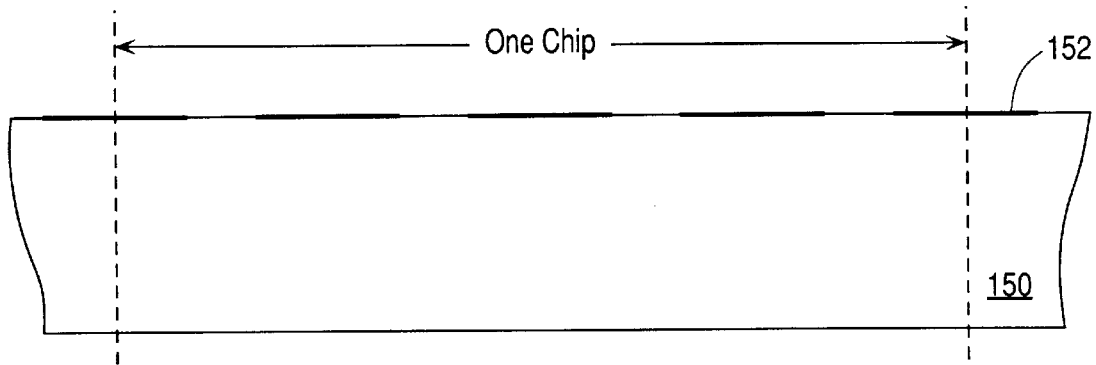

FIG. 4C is a sectional view of the portion of the blank after the development of photoresist 157 and etching of the exposed chromium in the regions corresponding to exposed regions 155a–155d in the photoresist. The chromium portions remaining between the stripe regions will remain on the finished phase mask.

The blank, with the chromium having been removed in the stripe areas, is then coated with photoresist and the grating patterns are written into the photoresist as described above in connection with the fabrication of mask 70P.

Utilizing the concept of a tri-layer photoresist as described in the above-mentioned Howard et al. article, a tri-layer photoresist procedure can be prepared on the 90 mil thick quartz substrate as follows: 200 nm thinned AZ 5214E photoresist (AZ 5214E diluted in photoresist thinner) baked at 180° C. for an hour, then 10 nm thick germanium or silicon was deposited in a high vacuum evaporation system, followed by a spun-on 950K molecular weight 2% PMMA (200 nm thick) and baked again at 160° C. for half an hour. Electron or ion-beam lithography can be utilized to direct write the desired pattern at twice the required actual pitches of the gratings.

As above, direct writing of the pattern is preferably performed in multiple passes with reduced electron or ion beam intensity. Specifically, instead of writing the gratings with a single-pass full-electron or ion-beam exposure dose, the gratings are written in multiple passes (at least 4) of electron or ion-beam exposure dose at 1/(number of passes) of the full exposure dose to minimize field and/or sub-field stitching errors in the gratings. Doses can also be varied from the chromium/quartz boundary to the center of the quartz to obtain a uniform grating pattern. Exposed PMMA can be developed in 1:1 volume ratio of methyl isobutyl ketone:isopropanol developer, and finally rinsed with isopropanol and dried in nitrogen gas.

Figure 4D:
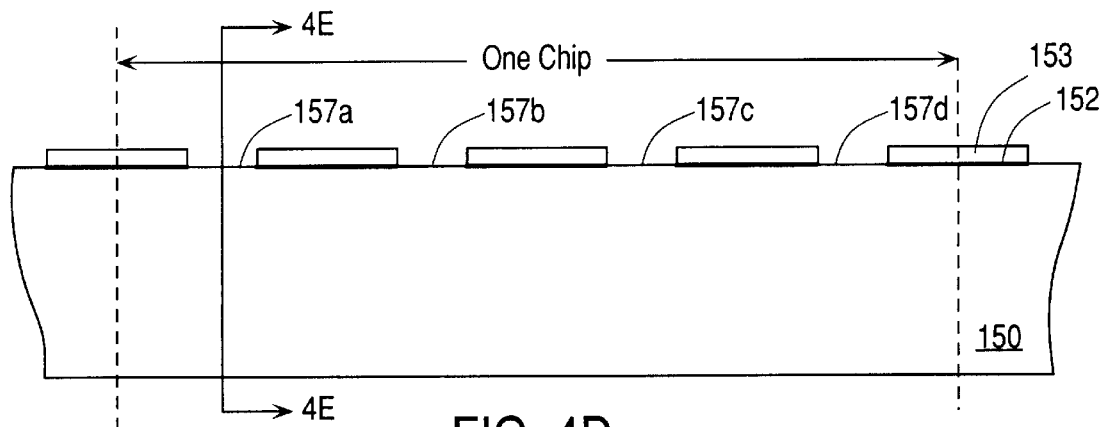
Figure 4E:
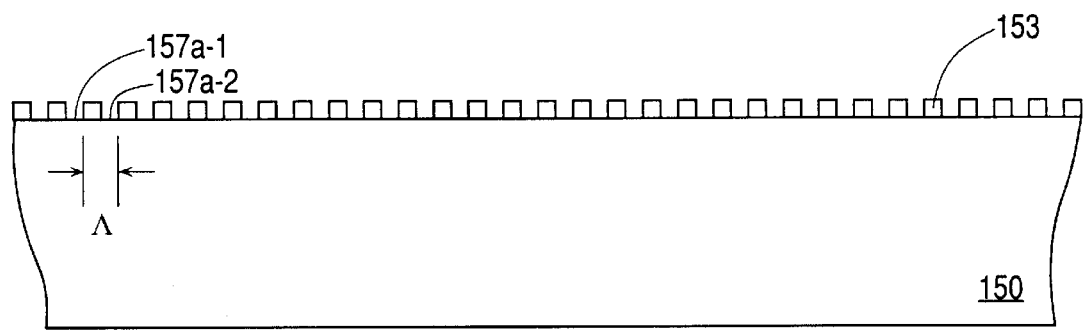

FIGS. 4D and 4E are sectional views showing the photoresist-coated blank after development of the photoresist. As can be seen, the regions of photoresist exposed by the electron or ion beam is removed by the development step, leaving bare regions 157a–157d of quartz substrate 150. These bare regions are segmented at the phase mask pitch as shown in FIG. 3E, and the individual segments are denoted 157a-1, 157a-2, etc.

Figure 4F:
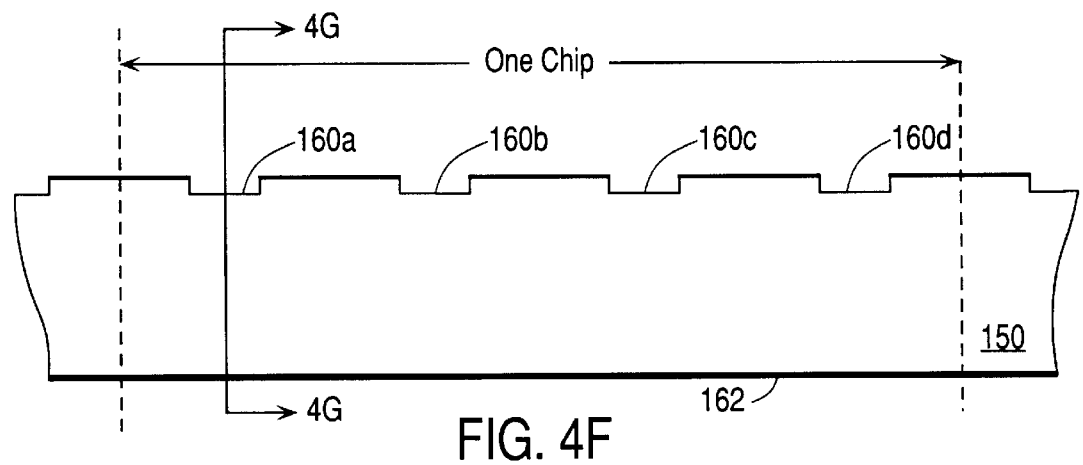
Figure 4G:
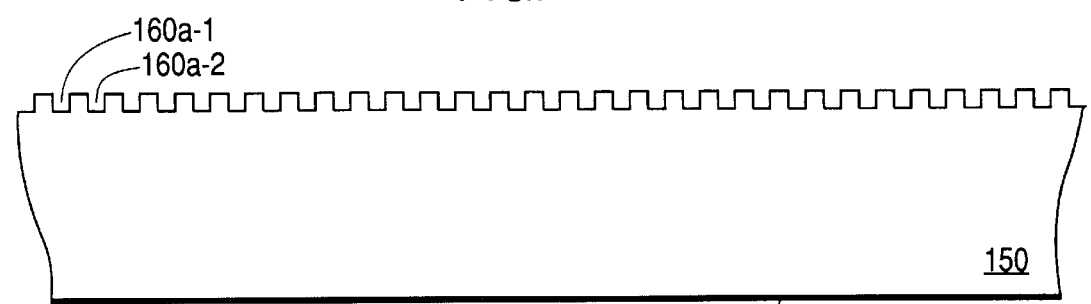

FIGS. 4F and 4G are sectional views showing the finished phase mask after etching bare regions 157a–157d of quartz to replicate the pattern in the photoresist 153, leaving regions 160a–160d of reduced depth substrate. These etched regions are segmented at the phase mask pitch as shown in FIG. 4G, and the individual etched segments of etched region 160a are denoted 160a-1, 160a-2, etc. The etching is preferably done by a process that etches the quartz substrate to a depth corresponding to a π phase shift. Etched regions 160a1, etc., and the alternating unetched regions of quartz material therebetween ultimately define the grating.

In the case of a germanium-based tri-layer photoresist, the quartz plate can be etched briefly in deionized water and dried in nitrogen to remove native germanium oxide on the germanium. In both germanium-based and silicon-based tri-layer photoresists, the germanium or silicon can be etched in a low pressure reactive ion (or magnetically enhanced) etcher utilizing $CF_4$ gas plasma. The underlayer of hard baked photoresist can be etched sequentially in a low pressure reactive ion (or magnetically enhanced) etcher utilizing $O_2$ gas plasma and the quartz was etched to the desired precise depth to obtain the desired π phase shift in a low pressure reactive ion etcher (or magnetically enhanced reactive ion etcher) utilizing a $CF_4$—Ar mixture. Depth can be controlled by monitoring the etch time, profiling the etch depth in the test signature areas and emission spectroscopy of the etch gas by-products during the etch. Final removal of the 180° C. baked photoresist can be accomplished by using a commercially available photoresist stripper, high pressure reactive ion etching in pure $O_2$ gas plasma, and commercially available nanostripe.

The phase mask is then subjected to final surface preparation and deposition of a backside antireflection coating 162.

3.0 Grating Fabrication and Possible Geometries

Figure 5A:
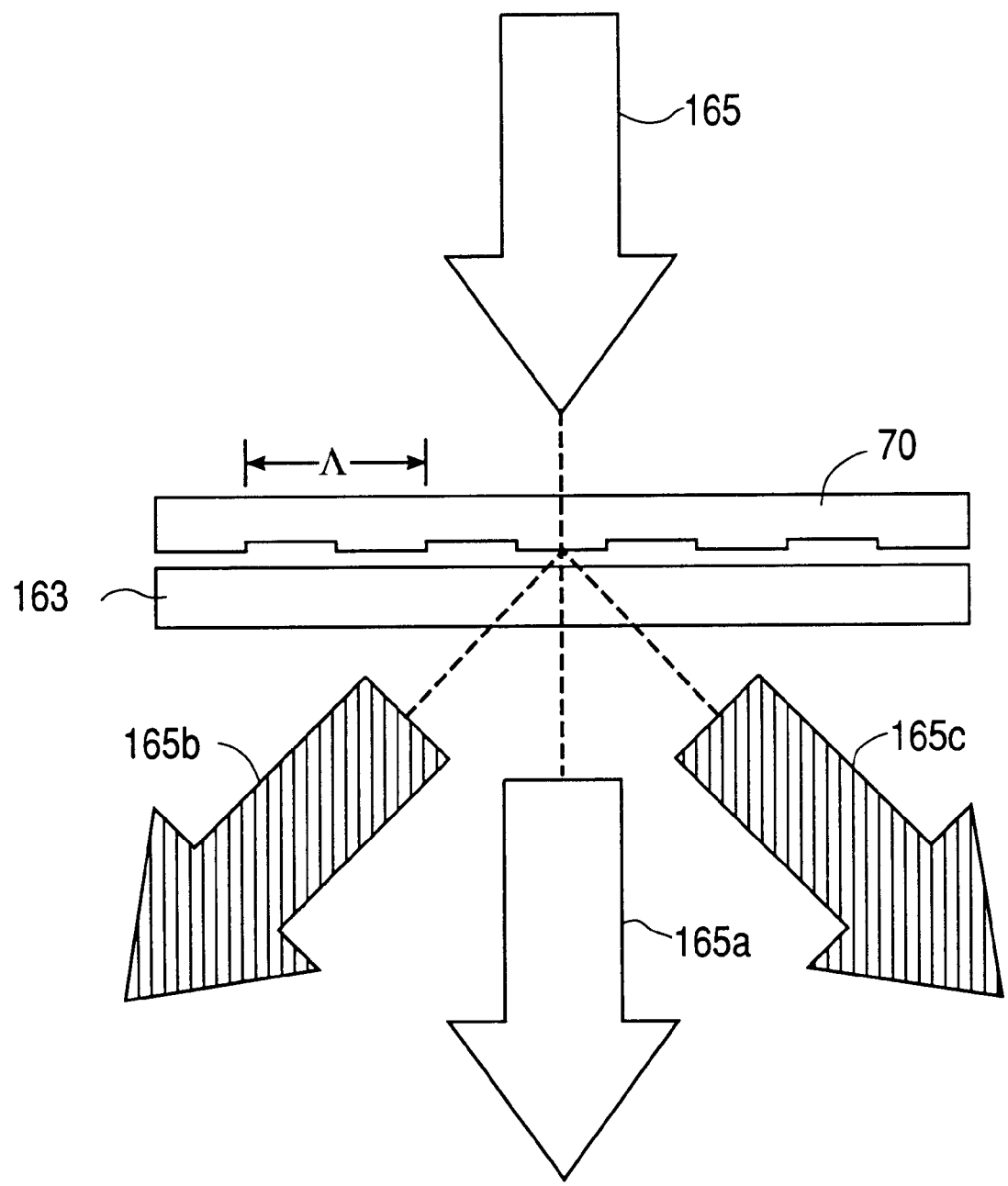
FIG. 5A shows the use of a π phase-shifted phase mask to expose a substrate.

FIG. 5A shows phase mask 70, which may be fabricated as shown above, used in connection with exposing a photoresist-coated (say, 40 nm thickness of photoresist) wafer 163 with a normally incident beam of coherent or non-coherent light, designated 165. This exposure and subsequent processing is for the purpose of forming the grating pattern in grating layer 50 (FIG. 1C) in the laser chip. The phase mask is in contact or near contact with the wafer (the case of near contact is explicitly illustrated). Also shown are the various diffraction orders including the m=0 order diffracted beam 165a, the m=−1 order diffracted beam 165b, and the m=−1 order diffracted beam 165c. Due to the π phase shift, the m=0 order diffracted beam is canceled and the first order beams 165b and 165c interfere to form the image. As discussed above, the nature of the phase mask is that the patterns on the wafer have a spatial frequency that is twice that of the pattern on the phase mask. That is, the pitch of the grating pattern on the phase mask is twice the desired/designed grating pitch. After exposure, the photoresist is developed, and the grating pattern etched in the wafer using a standard wet or dry etching process.

Advantages of using a phase mask with normally incident illumination, in addition to achieving finer patterns, include the ability to make gratings of different pitches on the same substrate, and to make curved gratings.

Figure 5B:
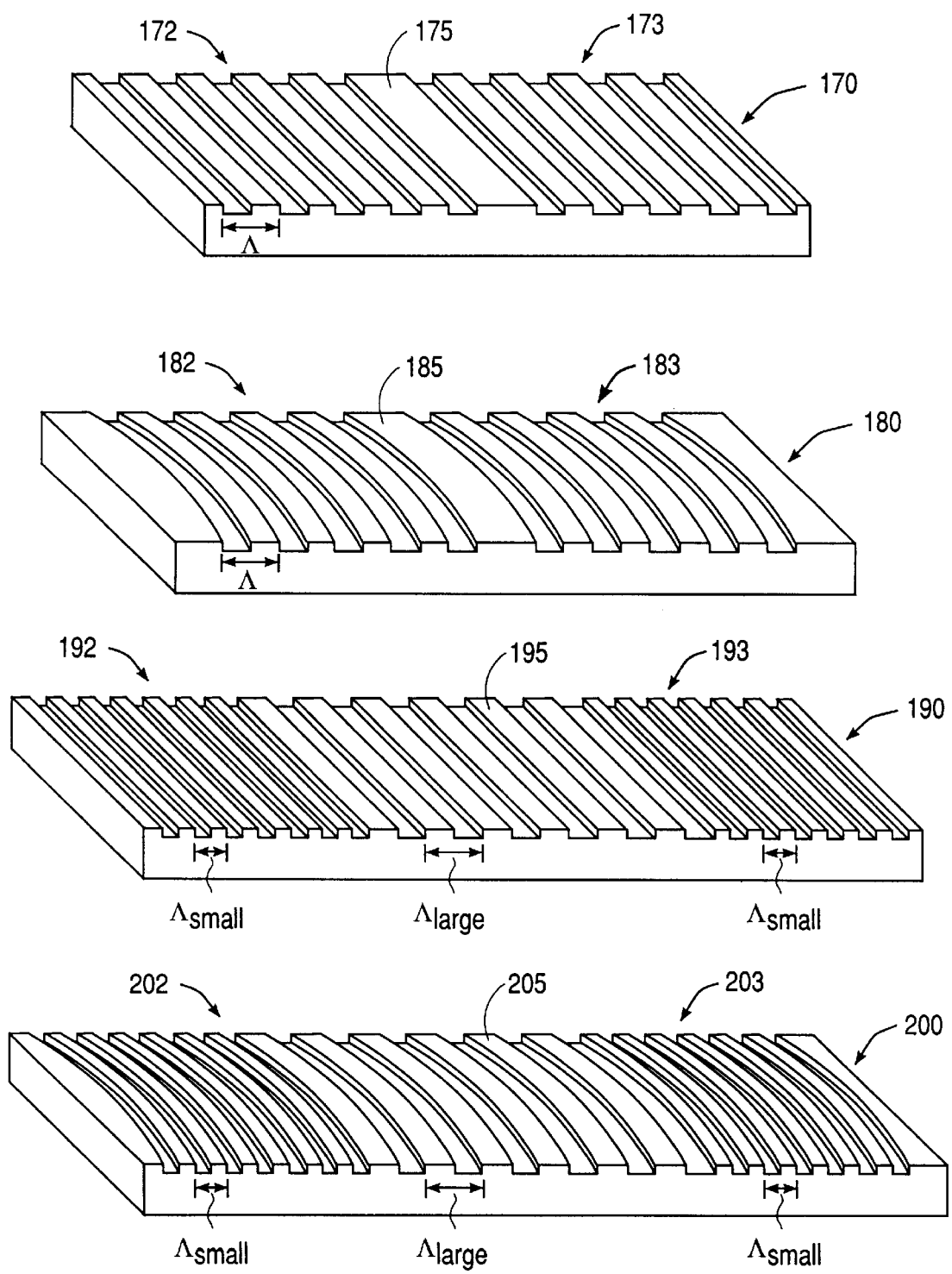
FIG. 5B shows constant pitch and variable pitch linear and curved gratings that can be made using a π phase-shifted phase mask.

FIG. 5B shows four different possible grating configurations that can be made using processes according to the invention. A linear grating 170 is shown having segments 172 and 173 of a constant pitch Λ separated by a λ/4 phase-shifted region 175. Embodiments of the laser chip according to the invention include multiple linear gratings, each with a λ/4 phase-shifted region, with each grating having a different pitch to support multi-wavelength operation.

A curved grating 180 is shown having constant-pitch curved grating segments 182 and 183 separated by a λ/4 phase-shifted region 185. A linear grating 190 is shown having segments 192 and 193 of a first constant pitch, designated $\lambda_{small}$, separated by a segment 195 of a larger pitch, designated $\lambda_{large}$. A curved grating 200 is shown having curved grating segments 202 and 203 of a first pitch $\lambda_{small}$, separated by a curved grating region 205 of a larger pitch $\lambda_{large}$.

Figure 5C:
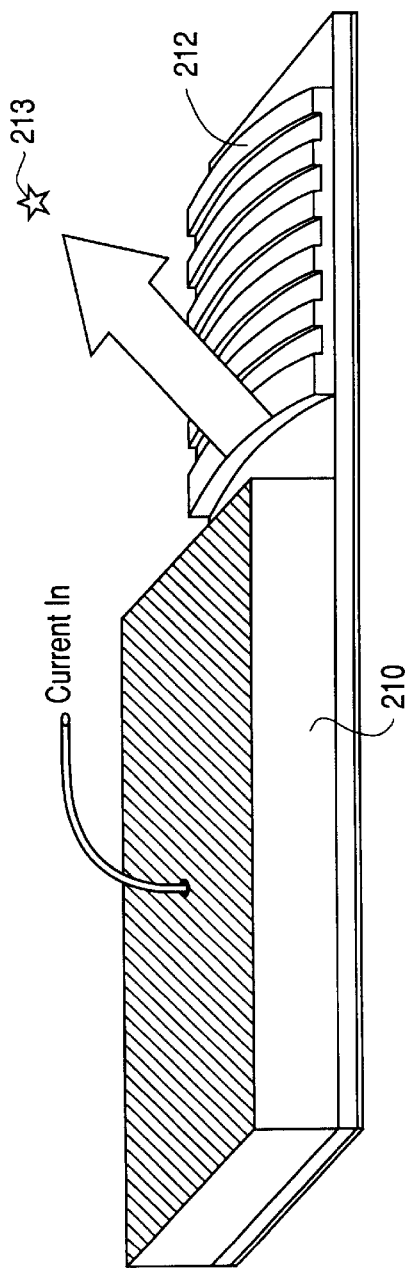
FIGS. 5C and 5D show applications of curved gratings.
Figure 5D:
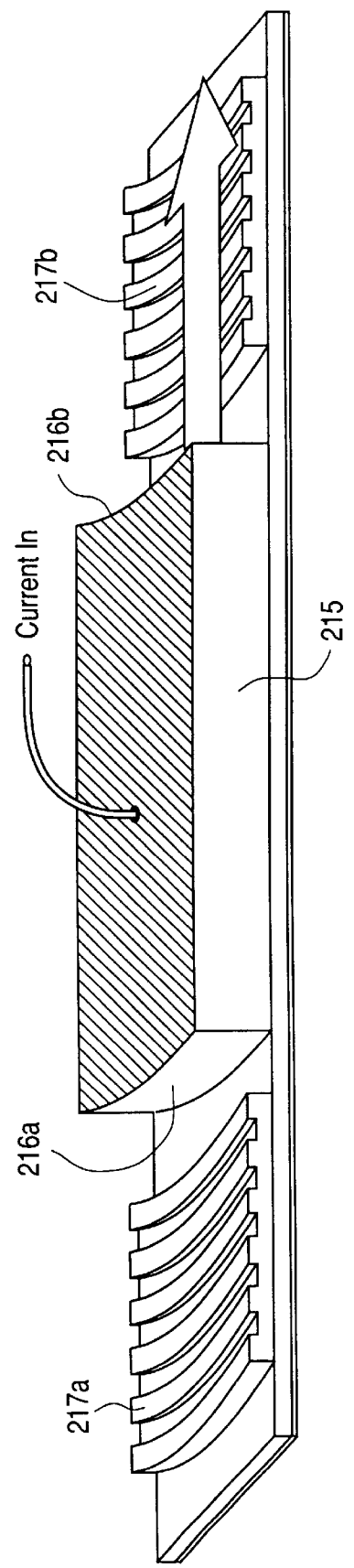

FIGS. 5C and 5D show representative applications of curved gratings. As mentioned above, the laser chip illustrated in FIG. 1A uses four straight gratings of different pitches, each with a λ/4 phase-shifted region. The applications shown in FIGS. 5C and 5D can be used with many different kinds of lasers, and in these cases, the gratings are outside the laser cavities. FIG. 5C shows a vertically focusing laser diode configuration with a laser diode 210 and a curved grating 212 to provide focus at a spot 213. FIG. 5D shows a high-power unstable resonator laser diode configuration with a laser diode 215 (having curved mirrors 216a and 216b) and a pair of curved gratings 217a and 217b.

4.0 Laser Chip Fabrication 4.1 Patterning and Etching Process

In current implementations, the laser chip fabrication begins with the purchase of a commercially available laser diode wafer from a supplier such as EPI, located in Londonderry, N.H. Wafers may also be obtained from Semia, San Francisco, Calif. A commercially available laser diode wafer includes, for example, the following layers, starting from the top:

p+ doped top metal contact (InGaAs)
p doped under cladding (InP/InGaAsP)
grating layer (InGaAsP)
multi-layer active region (alternating quantum well and barrier layers)
n doped lower cladding (InP/InGaAsP)
n+ doped substrate (InP)

FIGS. 6A–6H show the fabrication steps for fabricating the ridge laser arrays. The drawings are not to scale—for example, thicknesses have been greatly exaggerated. In specific implementations, the laser chips are fabricated on 2-inch wafers. The wafers can be purchased with some or all of the lasers above the grating layer present or missing. Depending on the particular wafer, the gratings are etched in the grating layer (the overlying layers, if originally present, having been removed), and the upper layers are regrown.

The grating patterns are etched using phase mask 70 and standard photolithography. The exposure of the grating patterns using the phase mask was described above. As noted above, the exposure can be done using coherent or incoherent light. At this point, the gratings have been covered over; however, their precise locations must be known in order to form the ridge laser structures over the gratings.

Figure 6A:
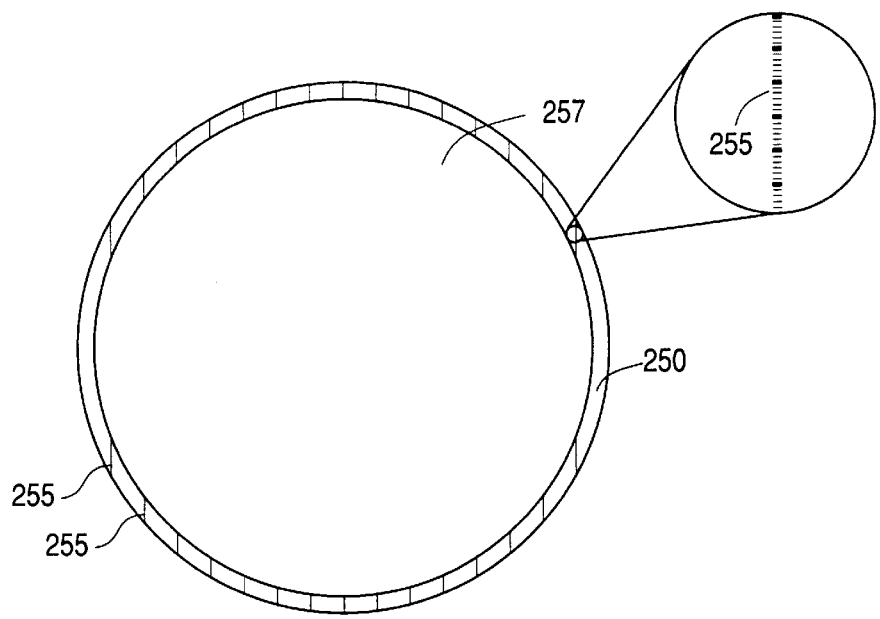
FIGS. 6A–6H show the fabrication steps for a method of making a laser chip.

FIG. 6A is a schematic top view showing a laser wafer 250 at the point where the gratings, designated 255, have been etched, the overlying semiconductor material 257 (for example, InGaAsP/InP/InGaAs) regrown, and the wafer subjected to edge opening photolithography and wet etching to locate the gratings. The regions containing the grating patterns, referred to as the grating stripes, are denoted schematically as solid lines since they are only a few microns wide (10 microns in a specific embodiment) but extend across the wafer. Also, as mentioned above, the gratings are on ½-mm centers (500 microns), which means that there would be on the order of 100 grating stripes on the wafer rather than the smaller number shown. Each stripe's grating pattern extends perpendicular to the direction of the stripe, as shown in the magnified portion.

Figure 6B:
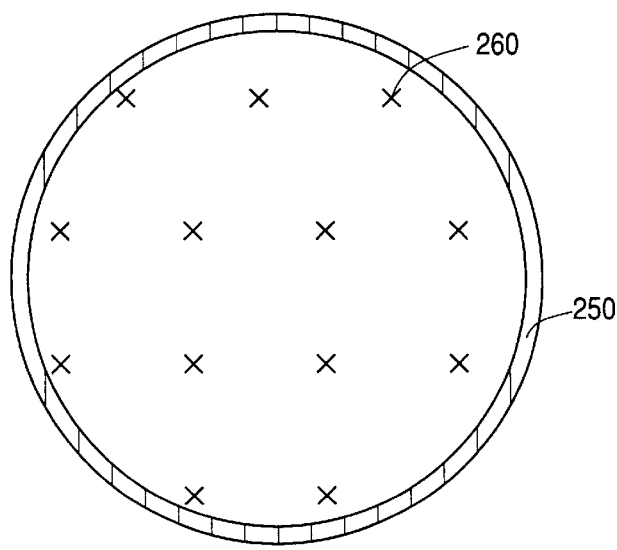

FIG. 6B shows the portion of the wafer after an insulating layer, such as silicon nitride or silicon dioxide, has been deposited over the wafer and alignment marks 260 have been formed by photolithography and etching of the insulating layer. The alignment marks are shown as crosses, and are located at various locations on the wafer. In a specific embodiment, the alignment marks are located every 10 or 20 chips. Since the active regions of the laser structures occupy a small fraction of the 2-mm width of the chip, it is a simple matter to locate the alignment marks over a portion of the chip that is removed from the active regions (say, near one of the isolation trenches).

Figure 6C:
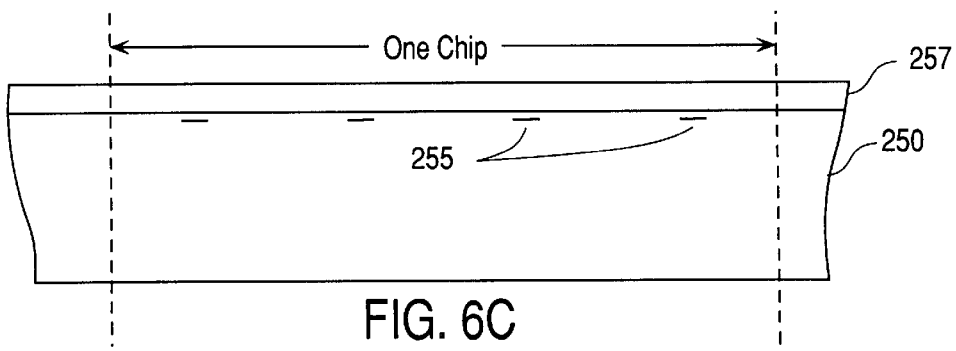

FIG. 6C is a schematic sectional view showing a portion of laser wafer 250 that corresponds to a little more than one laser chip in width. The wafer has not been separated into individual chips, so the structures whose formation will now be described extend from one edge of the chip to the other (registered to the grating stripes). The grating stripes are shown just underlying regrown material 257.

Figure 6D:
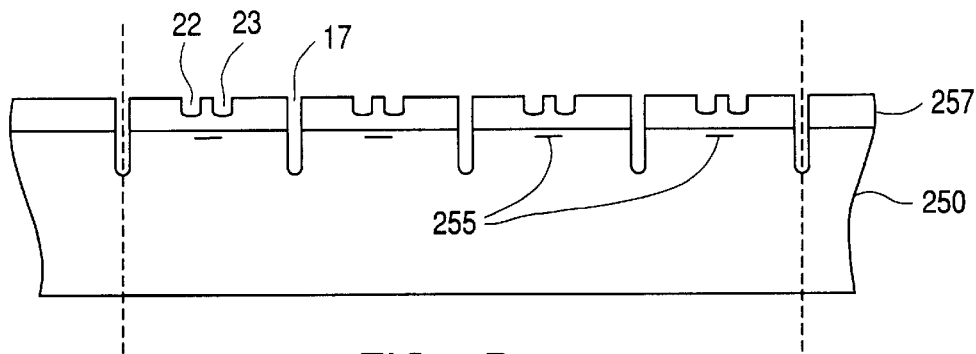

FIG. 6D shows the portion of the wafer after etching trenches 22 and 23 (FIG. 1C) to define the ridge waveguide, and etching more deeply between the lasers' active regions to define isolation trenches 17 (FIG. 1A). The trenches may be etched utilizing a combination of reactive or magnetron enhanced reactive ion etching (methane and hydrogen gas mixture at room temperature or chlorine and argon gas mixture at 300° C.) and wet etching in hydrochloric acid and water in the volume ratio of 4:1.

Figure 6E:
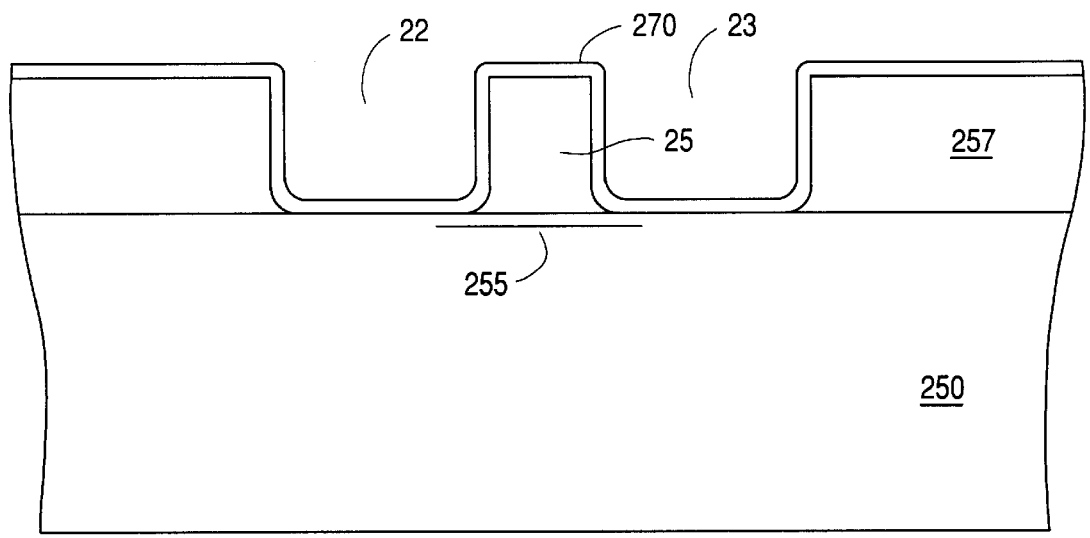

FIG. 6E shows a more localized portion of the wafer after deposition of a conformal insulating layer 270, which can be of a material such as silicon nitride, silicon dioxide, or cyclotene, and subsequent annealing to densify and relieve stress in the insulating material.

Figure 6F:
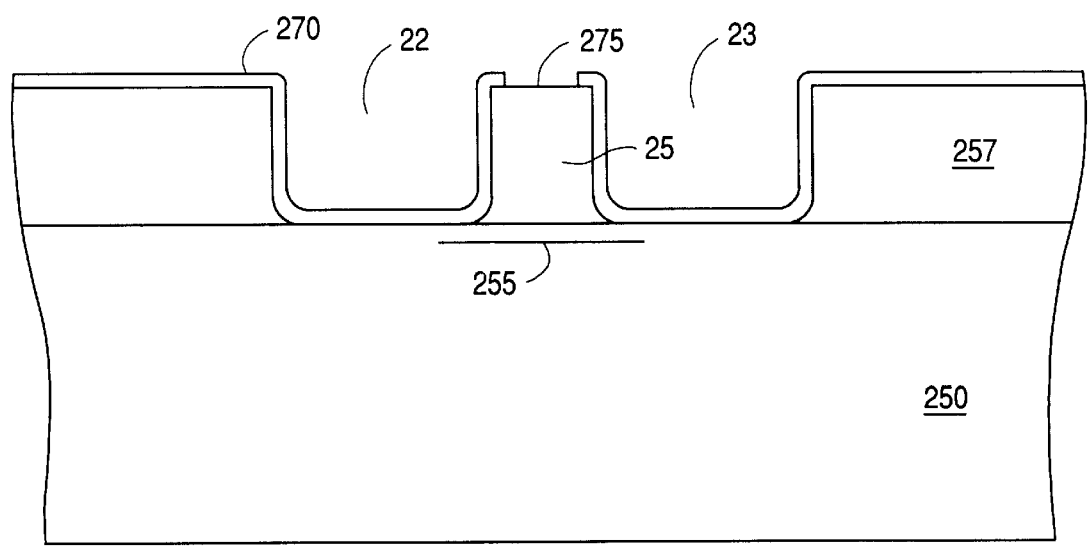

FIG. 6F shows the more localized portion of the wafer after insulating layer 270 has been patterned and etched to remove a portion of the insulating layer over ridge 25 to expose a region 275 of the underlying semiconductor material. Two-micron wide openings, precisely on top of the four-micron wide ridge waveguides (utilizing the alignment marks) can be made by reactive ion etching utilizing a $CF_4$ (98%) and $O_2$ (2%) gas mixture.

Prior to topside metallization, the semiconductor surface can be cleaned in low power $O_2$ plasma and buffered hydrofluoric acid, rinsed with deionized water, and dried in nitrogen gas to remove any native oxide on the semiconductor surface.

Similarly, a low-power broad-area argon ion beam or low energy low-pressure electron cyclotron resonance (ECR) sequential hydrogen, nitrogen, and argon plasma can be utilized in vacuum in-situ for a short time to remove any native oxide on the semiconductor surface prior to deposition of shoulder metal and p-metal contact deposition.

Figure 6G:
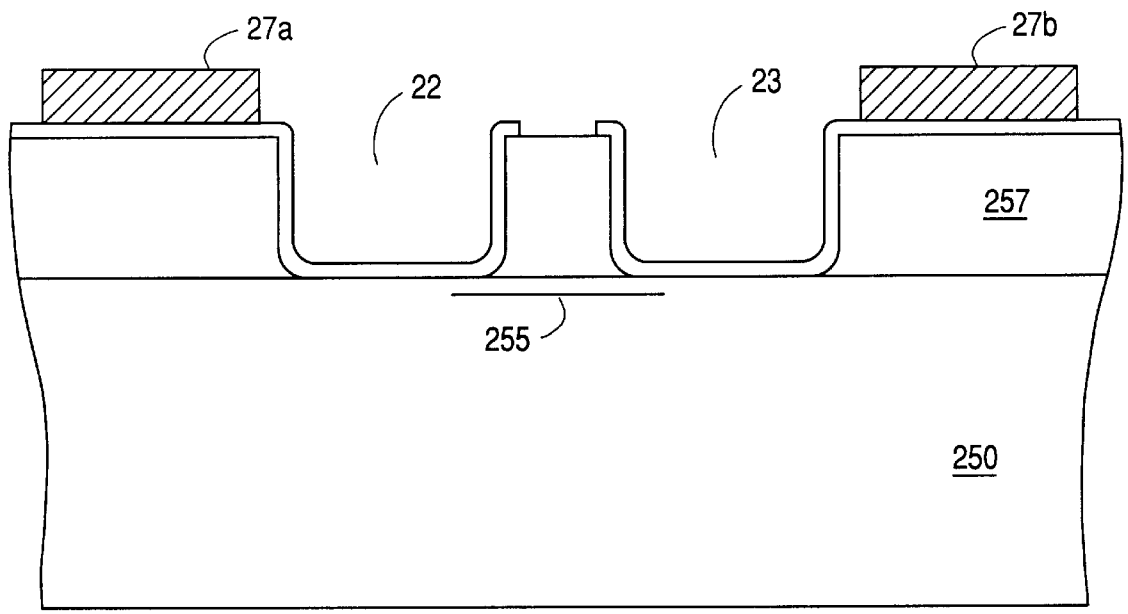

FIG. 6G shows the more localized portion of the wafer after metallization along the outside edges of trenches 22 and 23 has been carried out to define shoulders 27a and 27b (also see FIG. 1C).

Figure 6H:
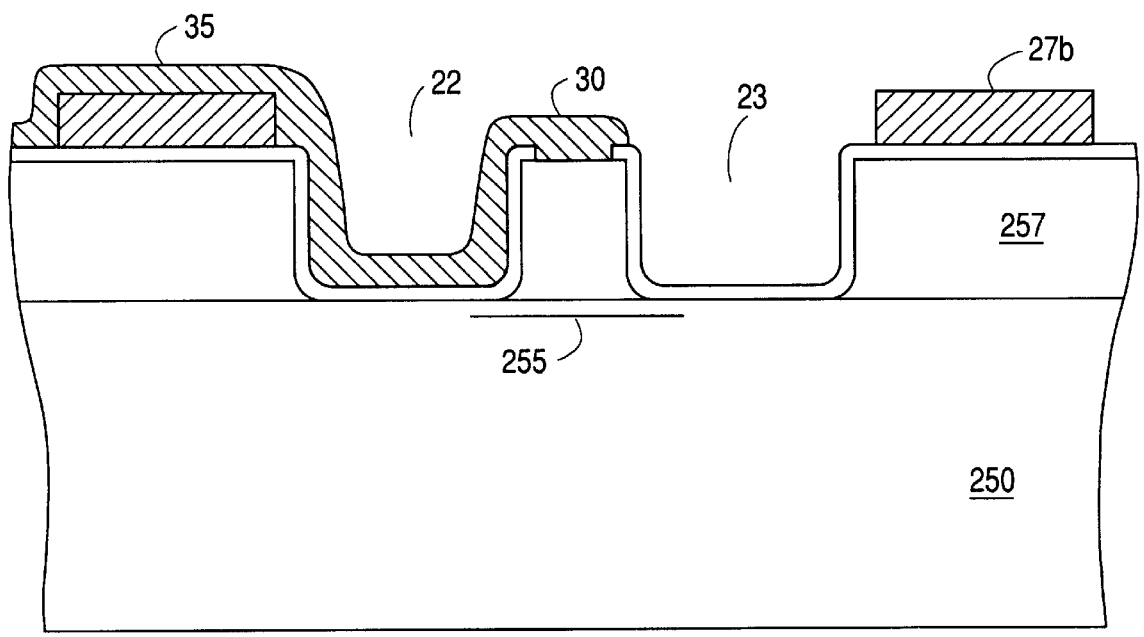

FIG. 6H shows the more localized portion of the wafer after contact metal 30 has been deposited covering region 275 (the top of the ridge), the inner surfaces of trench 22, and shoulder 27a. The selective metallization is carried out by photolithography and metal etching or metal liftoff according to well-known processes. It should be recognized that, at this point in the processing, contact metal 30, which extends to bonding metal 35, only contacts the semiconductor material atop the ridge while it is insulated from the inside surfaces of trench 22 by insulating layer 270 (FIG. 6E), while shoulders 27a and 27b sit atop insulating layer 270. It is also possible to have contact metal 30 extend to cover shoulder 27b, as mentioned earlier.

Shoulders 27a and 27b and contact metal 30 may comprise conventional (Ti/Pt/Au) metal of respective thicknesses 20 nm, 60 nm, and 200 nm, deposited sequentially by either electron beam evaporation or sputtering. This can be utilized as shoulder or contact p-metal. An improved sputtered p-metal contact (Ti/TiN/Pt/Au) of sequential thicknesses 20 nm, 40 nm, and 200 nm, respectively, can also be utilized.

To improve the laser diode device reliability and lifetime, a novel metalization scheme can be utilized. In order to prevent gold (Au) in the contact from diffusing into the ridge, a four-layer alternating structure of TiN and Pt layer can be used between the Au and the semiconductor. It is believed that this will significantly improve the operating lifetime of the laser chip.

The wafer is then thinned (backside lapped and polished) to a desired dimension, 110 microns in one example. In one example, prior to backside metallization, backside native oxide of the very fragile wafer can be removed in buffered hydrofluoric acid, very carefully rinsed with de-ionized water, and dried with $N_2$, and immediately loaded into an electron-beam evaporator or sputtering system for backside n-metal contact. A low-power broad-area argon ion beam or low-energy/low-pressure electron cyclotron resonance (ECR) sequential hydrogen, nitrogen, and argon plasma can be utilized in vacuum/in-situ for a very short time to remove any native oxide on the semiconductor surface prior to deposition of n-metal contact deposition.

Backside n+ contact metal layer 32 (FIG. 1C) can consist of Ni/Ge/Au/Ni/Ag/Au or respective thicknesses 5 nm, 25 nm, 50 nm, 5 nm, 60 nm, and 200 nm. This can be deposited sequentially by either electron beam evaporation or sputtering, and is highly reliable. An apparently even more reliable alternative backside metallization can be sequentially sputtered $G/Au/Ni/WSi_2/Ti/WSi_2/Au$ metallization of respective thicknesses 20 nm, 5 nm, 5 nm, 50 nm, 5 nm, 50 nm, 200 nm, and is believed to be the preferred configuration. The backside n-metal contact was rapid thermal alloyed at 325° C. in a nitrogen gas environment. An additional bonding metal (Ti/Au 50 nm/200 nm) may be deposited for better bonding.

The wafers are then scribed and cleaved into laser bars. Each laser bar has a length of ½ mm (length of laser cavities in finished chip), but comprises multiple wafer chips, being as wide as the wafer is wide at that location. In one example, the emitting facets of the laser bars were then cleaned with a very low-power broad-area argon ion beam or low-energy and low-pressure electron cyclotron resonance (ECR) sequential hydrogen, nitrogen, and argon plasmas for a short time to remove any native oxide on both facets of the laser arrays without any crystalline damage to the facets.

At this point the front and back facets of the laser bars are coated with anti-reflection coatings. In various examples, these coatings are durable and dense single-layer Gallium Gadolinium Garnet (GGG) or $Sc_2O_3$ (scandium oxide). In what is a presently preferred example, a multi-layer $Ta_2O_5$ (tantalum oxide) and $Al_2O_3$ (aluminum oxide) dielectric was deposited by ion-beam assisted electron beam evaporation or sputtering at high deposition temperature for less than 0.1% anti-reflective coatings. In one example, the tantalum oxide and aluminum oxide thicknesses were 120 nm and 136 nm, respectively. Durable and dense coatings of single layer GGG or $Sc_2O_3$ or multi-layer $Ta_2O_5$ and $Al_2O_3$ can enhance the reliability and lifetime of the laser chip.

The laser bar is then scribed and cleaved into individual laser chips. The size of a four-laser multi-wavelength DFB ridge laser array chip is about 2 mm×0.5 mm (4 mm×0.5 mm for an 8-laser chip), and susceptible to damage during processing, testing, and packaging. This type of handling damage can cause severe yield loss during burn-in and can cause reliability problems in the field. After significant experimentation, it was found that this damage can be significantly minimized by the overlayer of shoulder metal to protect the active layer from damage during processing, testing, and packaging.

4.2 Process Summary

The laser chip fabrication steps, selected ones of which were described in connection with FIGS. 6A–6H above, can be summarized as follows.

1 Design of multi-quantum well laser material;
2 Epitaxial growth;
3 Fabrication of multiple pitch gratings by phase mask;
4 Regrowth over gratings;
5 Identification of grating location (photolithography and etching);
6 Deposition of an insulator ($SiN_x$ or $SiO_2$);
7 Definition of $SiN_x$ or $SiO_2$ alignment marks (photolithography and etching);
8 Definition of ridge over gratings and isolation trench utilizing $SiN_x$ or $SiO_2$ alignment marks (photolithography and etching);
9 Deposition of conformal low stress dense $SiN_x$ or $SiO_2$ or cyclotene;
10 Contact opening of $SiN_x$ or $SiO_2$ or cyclotene on top of the ridge (photolithography and etching);
11 Definition of shoulder metal (photolithography and etching or lift off);
12 Definition of reliable contact metal on top of the ridge; (photolithography and etching or lift off);

13 Au plating to improve p-metal step coverage;
14 Lapping/thinning and polishing of the substrate;
15 Surface preparation of the thinned substrate;
16 Backside metallization;
17 Metal alloying;
18 Scribing wafer into laser bars;
19 Facet coating of laser bars to improve performance and reliability; and
20 Scribing laser bars into laser chips.

4.3 Specific Laser Structures

The multi-quantum well (MQW) separate confinement heterostructure (SCH) InP/InGaAsP material structures for specific embodiments are fully optimized (composition and thickness) for DFB ridge laser array applications. The active layer width in the ridge laser is 3 micron, as opposed to about 1 micron active laser width in buried heterostructure lasers. Small variations in the active layer in the ridge laser will not significantly change the wavelength accuracy for WDM applications. In the case of a ridge laser, the etching is stopped above the active layer; in the case of a buried heterostructure, the active layer is etched through. Hence the ridge laser tends to provide better reliability and higher wavelength yield. It is noted, however, that ridge lasers have a higher undesirable threshold current than buried heterostructures. The quantum wells are at 1% compressive strain and barriers are at 1% tensile strain. This strain compensation provides higher reliability and improves the lifetime of the laser array device. The thickness and composition of the separate confinement layers are also optimized for optimum grating coupling, higher bit-rate device, and optimum far-field pattern of the laser array device for coupling to the single-mode optical fibers.

Specific implementations of the multi-quantum well (MQW) separate confinement heterostructure (SCH) laser chip are set forth in Tables 1–4 below.

TABLE 1

First Growth Design #1
InGaAsP based strain campensated MQW SCH structure at 1.55 μm emission wavelength

| Layer | Material | Composition μm | Thickness μm | Level | Type |
|---|---|---|---|---|---|
| 10 | InGaAs | Contact cap | 0.20 | 2E+19 | p++/Zn |
| 9 | InP | | 0.50 | 8E+18 | p+/Zn |
| 8 | InP | | 0.75 | 8E+17 | p/Zn |
| 7 | In(x)GaAs(y)P | 1.15 | 0.05 | 5E+17 | p/Zn |
| 6 | InP | | 0.25 | 5E+17 | p/Zn |
| 5 | In(x)GaAs(y)P | 1.20 | 0.10 | | U/D |
| 4x3** B | In(x)GaAs(y)P | 1.20 | 0.0150 | | U/D |
| 3x4* QW | In(x)GaAs(y)P | 1555 nm PL | 0.0094 | | U/D |
| 2 | In(x)GaAs(y)P | 1.20 | 0.10 | | U/D |
| 1 | InP Buffer | | 2.00 | 5E+17 | n/S |
| 0 ++ | InP Substrate | | | 1E+19 | n++/S |

*Compressive strain E = +1%
**Tensile strain E = −1%

TABLE 2

First Growth Design #2
InGaAsP based strain campensated active MQW SCH structure at 1.55 μm emission wavelength

| Layer | Material | Composition μm | Thickness μm | Level | Type |
|---|---|---|---|---|---|
| 12 | InGaAs | Contact cap | 0.20 | 2E+19 | p++/Zn |
| 11 | InP | | 0.50 | 8E+18 | p+/Zn |
| 10 | InP | | 0.75 | 8E+17 | p/Zn |
| 9 | In(x)GaAs(y)P | 1.15 | 0.05 | 5E+17 | p/Zn |
| 8 | InP | | 0.15 | 5E+17 | p/Zn |
| 7 | In(x)GaAs(y)P | 1.15 | 0.09 | | |
| 6 | In(x)GaAs(y)P | 1.20 | 0.08 | | U/D |
| 5x3** B | In(x)GaAs(y)P | 1.20 | 0.0150 | | U/D |
| 4x4* QW | In(x)GaAs(y)P | 1555 nm PL | 0.0094 | | U/D |
| 3 | In(x)GaAs(y)P | 1.20 | 0.08 | | U/D |
| 2 | In(x)GaAs(y)P | 1.15 | 0.09 | | |
| 1 | InP Buffer | | 2.00 | 5E+17 | n/S |
| 0 ++ | InP Substrate | | | 1E+19 | n++/S |

*Compressive strain E = +1%
**Tensile strain E = −1%

TABLE 3

(1*) Second/Regrowth Deeign Over 1.15Q Gratings

| Layer | Material | Composition μm | Thickness μm | Level | Type |
|---|---|---|---|---|---|
| 10 | InGaAs | Contact cap | 0.20 | 2E+19 | p++/Zn |
| 9 | InP | | 0.50 | 8E+18 | p+/Zn |
| 8 | InP | | 0.75 | 8E+17 | p/Zn |
| 7 | In(x)GaAs(y)P | 1.15Q | 0.05 | 5E+17 | p/Zn |
| 6 | InP | | 0.25 | 5E+17 | p/Zn |

TABLE 3

(2*) Second/Regrowth Deeign Over 1.15Q Gratings

| Layer | Material | Composition μm | Thickness μm | Level | Type |
|---|---|---|---|---|---|
| 12 | InGaAs | Contact cap | 0.20 | 2E+19 | p++/Zn |
| 11 | InP | | 0.50 | 8E+18 | p+/Zn |
| 10 | InP | | 0.75 | BE+17 | p/Zn |
| 9 | In(x)GaAs(y)P | 1.15Q | 0.05 | 5E+17 | p/Zn |
| 8 | InP | | 0.15 | 5E+17 | p/Zn |

The main difference in the two designs set forth above lies in the thickness of the grating layer (single layer 5 in design #1 and layers 6 and 7 in design #2). The thinner layer of design #1 (0.10 microns), as opposed to the combined thickness of design #2 (0.17 microns), tends to provide greater device speed, but tends to present more difficulty in coupling the output light to the fiber.

5.0 Laser Chip Module

5.1 Module Overview

Figure 7A:
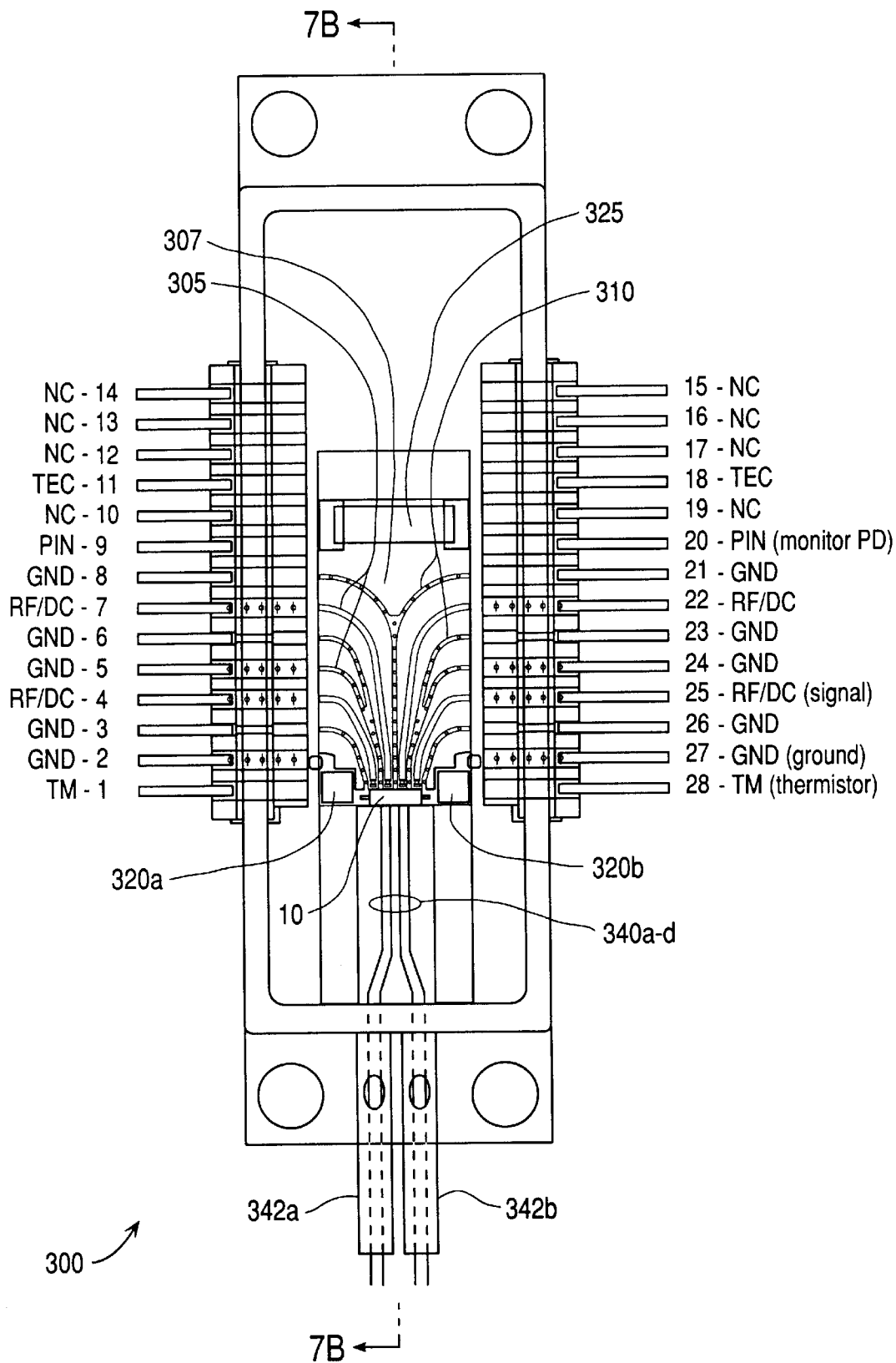
FIGS. 7A and 7B are top and side sectional views of a laser chip module.
Figure 7C:
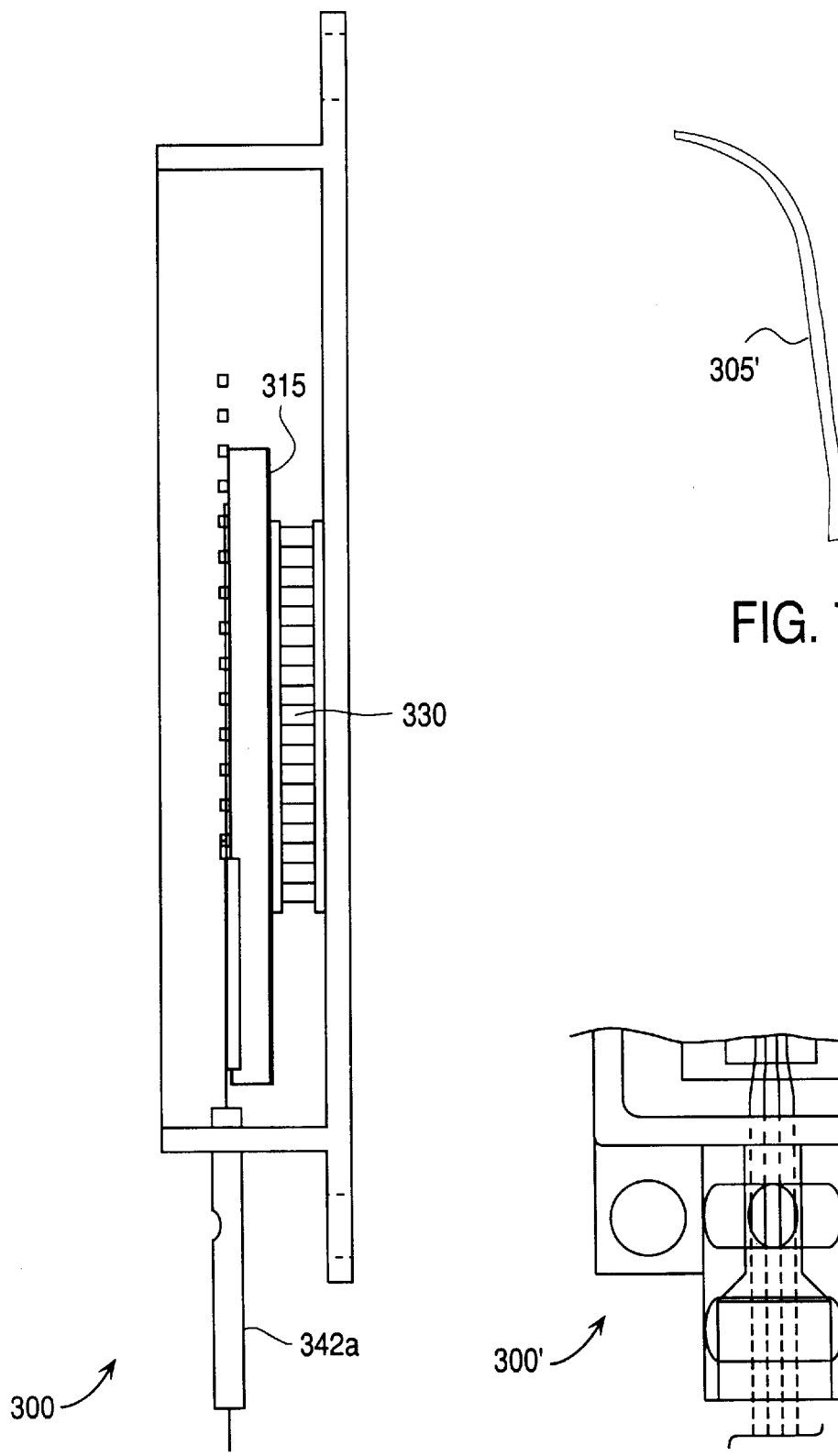
FIG. 7C shows a tapered transmission line.
Figures 7B, 7D:
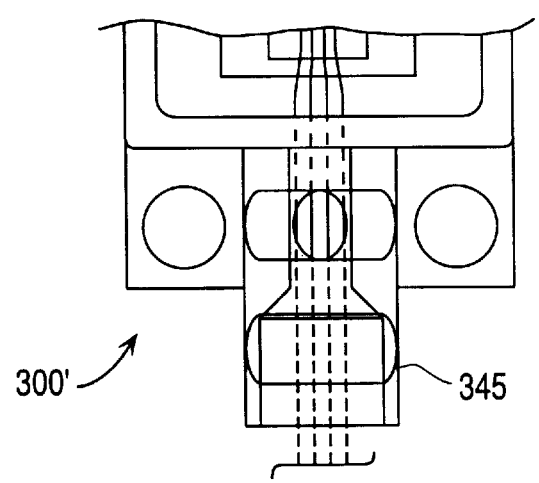
FIG. 7D is a fragmentary top view showing an alternative fiber tube arrangement.

FIGS. 7A and 7B are top and side sectional views, drawn generally to scale, showing laser chip 10 incorporated into a packaged module 300. A preferred package is a high-speed multi-optical fiber port "butterfly style" high speed ceramic package. The particular package illustrated has pins spaced by 50 mils. Suitable packages can be obtained from a number of commercial vendors including Kyocera America, Inc., located in Aliso Viejo, Calif.

In this embodiment, the laser driver chips (not shown) are outside the module, and their RF modulation signals, superimposed on a DC bias by a bias teen (not shown), are communicated to the lasers via RF/DC transmission lines 305, implemented as metal traces on a substrate 307. In one example, the modulation current is on the order of 65 ma while the DC bias current is on the order of 25 ma. This implementation shows a simplified RF/DC shielding scheme wherein RF/DC transmission lines 305 are bounded by ground lines 310, themselves also implemented as traces on substrate 307 with via holes through the substrate to a backside ground plane 315. The transmission lines and the ground lines may be of constant width, or as shown in FIG. 7C, one or more may be tapered in order to get optimum impedance matching and minimum return loss.

Additional elements within the module include a pair of thermistors 320a and 320b located on opposite sides of laser chip 10, a PIN photodiode 325, and a high heat removal capacity thermoelectric cooler (TEC) 330 mounted to the backside of the substrate.

The thermistors are coupled to a temperature-sensing circuit (not shown), which provides signals to a temperature-controlling circuit (not shown), which provides suitable voltages to TEC 330 to maintain a desired sensed temperature for stable operation. The PIN photodiode is a back facet monitor for providing a signal representing average optical power emitted through the back facet. In this embodiment, with a λ/4 phase-shifted region on the grating, both front and back facets are highly transparent, with the grating providing the feedback mechanism. Therefore the optical power through the front and back facets should b the same, and the back facet measurement provides a measurement representing the optical power being emitted through the front facet.

Substrate 307 is preferably a high efficiency heat spreader such as AlN, which is then bonded to another high efficiency heat spreader such as diamond, and then onto TEC 330 for precise temperature control. The thin film substrate incorporating the microwave transmission lines may be the same heat spreader or a suitable separate substrate (incorporating the microwave transmission lines) bonded onto the common heat spreader. In this approach, it is possible to place the laser driver chips on a separate printed circuit board outside the laser module package.

Also shown in the figure are optical fibers 340a–d that receive the light output from the individual lasers in laser chip 10, and bring the light outside the module through a pair of fiber tubes 342a and 342b, with each tube accommodating a pair of fibers. Once outside the module the fibers can be coupled to external optical elements, such as a wavelength multiplexer.

FIG. 7C is a fragmentary top view of a module, designated 300', showing an alternative arrangement for communicating the fibers out of the package. In this implementation, which represents a current implementation, a single tube 345, which accommodates all four fibers, is used rather than the pair of tubes 342a and 342b shown in FIGS. 7A and 7B.

Figure 8A:
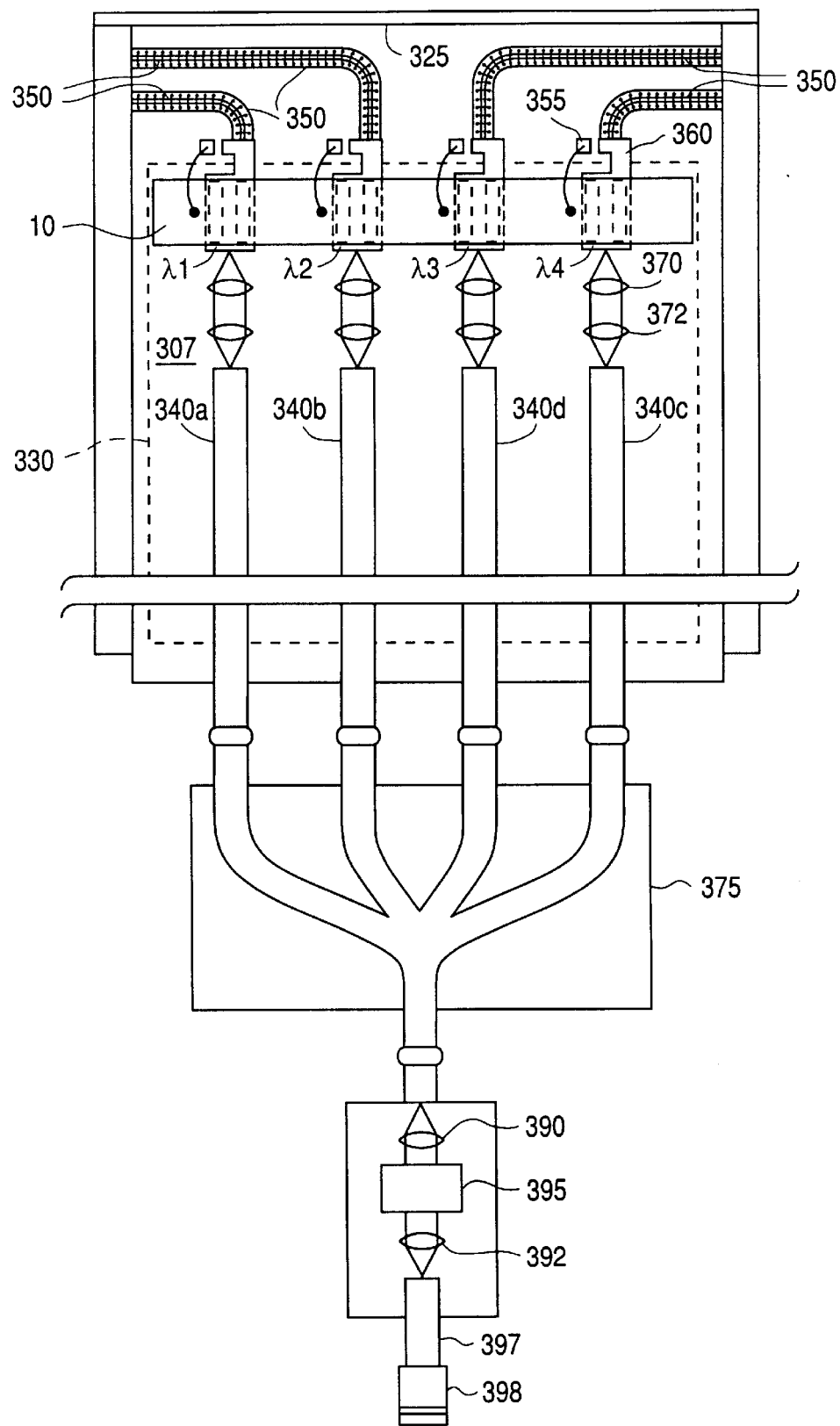
FIG. 8A is a top plan view showing additional implementations of the laser chip module.

FIG. 8A is a top plan view showing additional implementations of the laser chip module and its external optical connections. This figure is drawn with the various elements exaggerated in size for clarity. Elements corresponding to elements in the implementation of FIGS. 7A and 7B will be denoted by the same reference numeral. The implementation illustrated in this figure uses a more advanced isolation scheme for the RF/DC transmission lines, here denoted by reference numeral 350.

It is noted that the laser chip is mounted facedown on substrate 307. The electrode structure underlying each laser site of laser chip 10 includes a bonding electrodes 355 and 360. Bonding electrode 355 communicates with ground plane 315 by a via (not separately shown). The backside of laser chip 10, is wire bonded to bonding electrode 355 to effect backside grounding. Bonding electrode 360 includes a large portion to which the laser chip's bonding metal 35 is bonded, and a small portion which is wire bonded to the end of the active electrode of RF/DC transmission line 350.

5.2 Microwave Shielding

To modulate lasers at high bit rates, it s preferred to match the impedance of the lasers to the laser driver chips. The RF/DC signal lines are matched to the impedance of the laser drivers and terminated with appropriate thin film resistors. Further, as mentioned above, it is desired to provide a degree of electrical isolation between the various RF/DC signal lines in order to avoid cross-talk between the different signal channels driving the individual lasers. In the embodiment illustrated in FIG. 7A, isolation is provided by interposing grounded lines between the RF/DC transmission lines 305. A more aggressive isolation scheme is shown in FIG. 8A wherein metal transmission lines on substrate 307 have grounded, air-bridged U-shaped wires providing a series of arches, which act, in effect, as a partial coaxial shield.

Figure 8B:
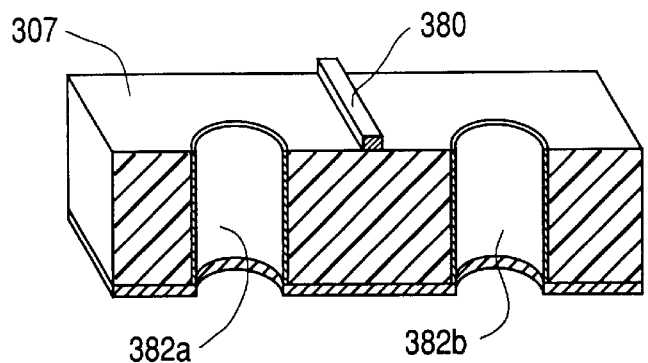
FIGS. 8B and 8C are detail views of implementations of isolation for the RF/DC transmission lines.

FIG. 8B is a fragmentary detail view showing a metal trace 380 running along substrate 307 and having metallized via holes 382a and 382b on respective sides. The pairs of holes are replicated along the length of signal trace 380 to provide the shielding.

Figure 8C:
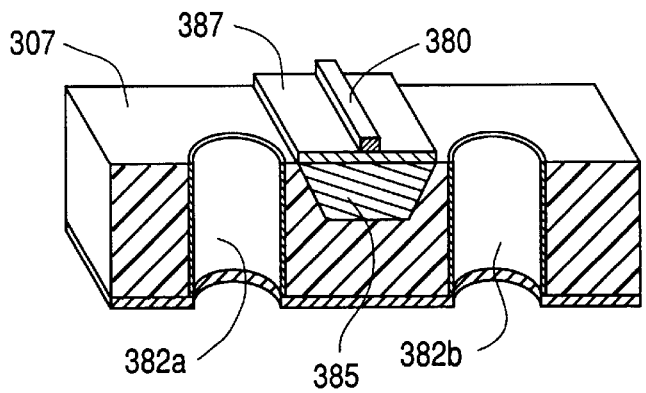

FIG. 8C illustrates a further refinement on this wherein the region of the substrate below the metal trace has been etched to form a channel which is filled with a dielectric 385, with a dielectric membrane 387 extending slightly outwardly of the edges of dielectric-filled channel 385.

The microwave substrate materials are thermally conducting and low loss for high frequency (5 GHz to 20 GHz) and high power (1 watt to 10 watt) applications. The laser chip is bonded onto microwave substrate using a low stress metallization (for example Ti/Pt/Au/Ti/Pt/TiN/Ti/AuSn of typical layer thicknesses 40/60/2000/40/100/40/300 nm) using gold-tin solder. Microwave simulations up to 10 GHz show that cross-talk is about −35 dB.

5.3 External Optical Interface

In a representative optical scheme, each laser's output is coupled to one of fibers 340a–d. Since single-mode optical fiber pigtailing to a laser array is much more difficult than multi-mode optical fiber pigtailing to a laser array due to optical mode mismatch, a microlens array is used to couple the lasers' outputs to the fibers. Thus, each laser's output is gathered and collimated by a collimating lens 370, and a focusing lens 372 focuses the collimated light into the fiber. The figure further shows fibers 340a–d fusion spliced to respective input ports of a wavelength multiplexer 375. The output port of multiplexer 375 is shown as fusion spliced to a compound isolation block to reduce back reflection into the laser chip. The isolation block is shown having a pair of lenses 390 and 392 on opposite sides of an optical isolator 395. Light is focused by lens 392 into the end of a segment 397 of fiber, which is connected to a standard fiber connector 398.

Figure 8D:
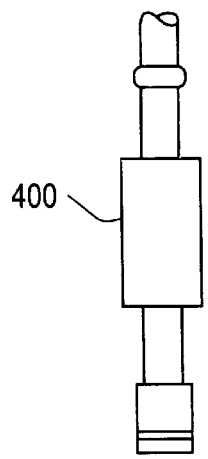
FIG. 8D is a fragmented top plan view showing an alternative external optical isolation scheme.

FIG. 8D is a fragmentary oblique view showing an alternative external configuration where an in-line optical isolator 400 is substituted for the compound isolation block shown in FIG. 8A.

5.4 Configuration with Laser Drivers Inside Module

Figure 9:
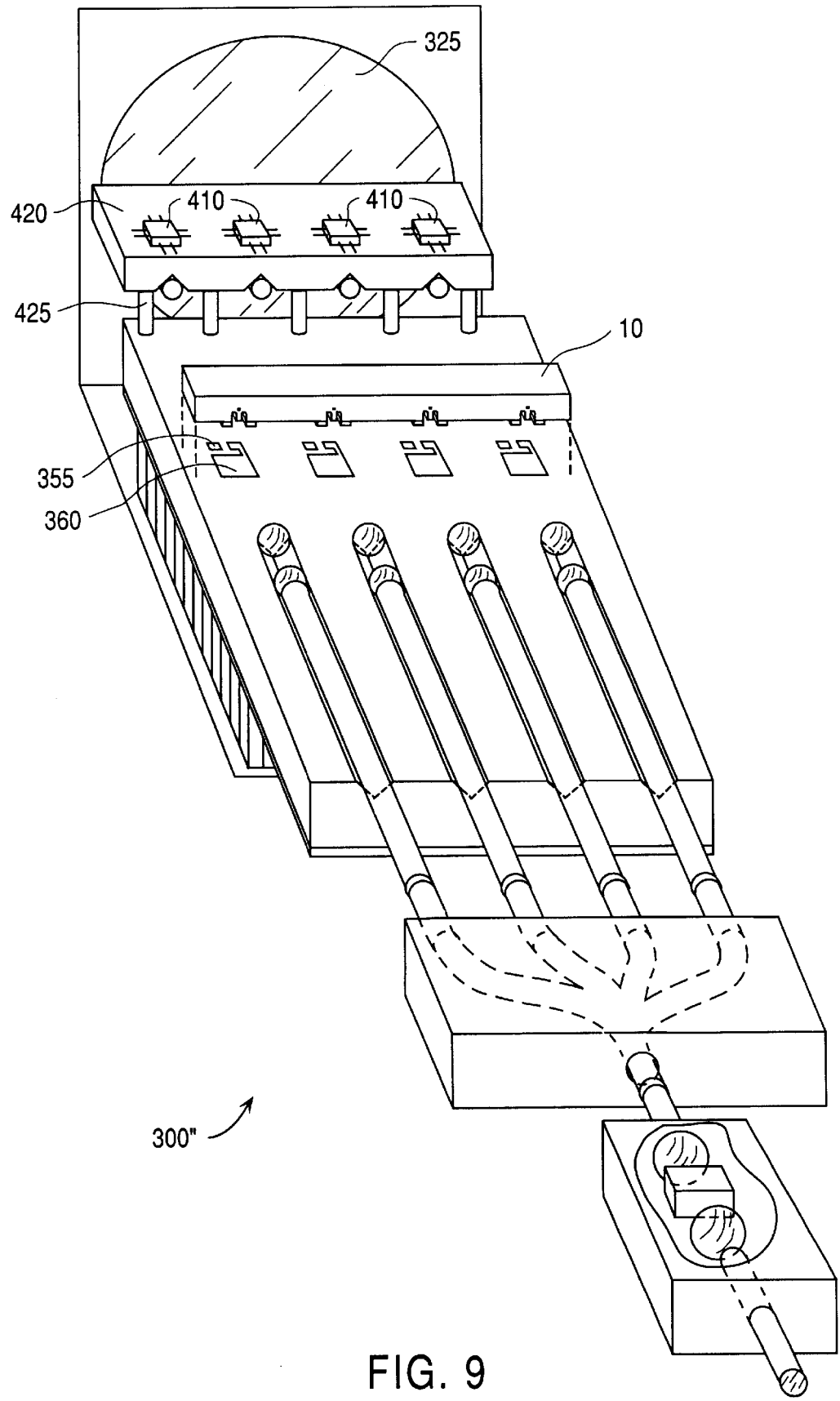
FIG. 9 is an exploded oblique view showing an alternative embodiment of the laser chip module.

FIG. 9 is an exploded oblique view, also not to scale, of an alternative configuration of the laser chip module, designated 300". Elements corresponding to elements in the implementations of FIGS. 7A, 7B, and 8A will be denoted by the same reference numeral. In this implementation, the laser driver chips, denoted 410, are located in very close proximity (less than 2 mm) to laser chip 10 within the module.

This configuration has the advantage that the laser module is very compact. However, the laser driver chips may generate a lot of heat and at this close proximity (2 mm) to the laser chip, the generated heat from the laser drivers may influence the thermal and optical parameters of the multi-wavelength laser chip, despite the use of TEC 330 for precise laser temperature control. To solve this problem, separate thermal paths for the laser chip and the laser drivers were utilized. Thus, laser driver chips are mounted to a separate heat spreader 420, which is mounted to substrate 307 by a set of thermal isolation elements 425.

5.5 Laser Drivers

The multi-wavelength DFB laser array has a common substrate (InP) for the lasers, so driving the individual lasers is difficult due to this common cathode configuration. This can be solved by utilizing a commercial laser driver circuit in conjunction with an external current mirror circuit. This external current mirror circuit acts as a current source, and allows the cathode of the laser diodes to be at ground potential.

Figure 10A:
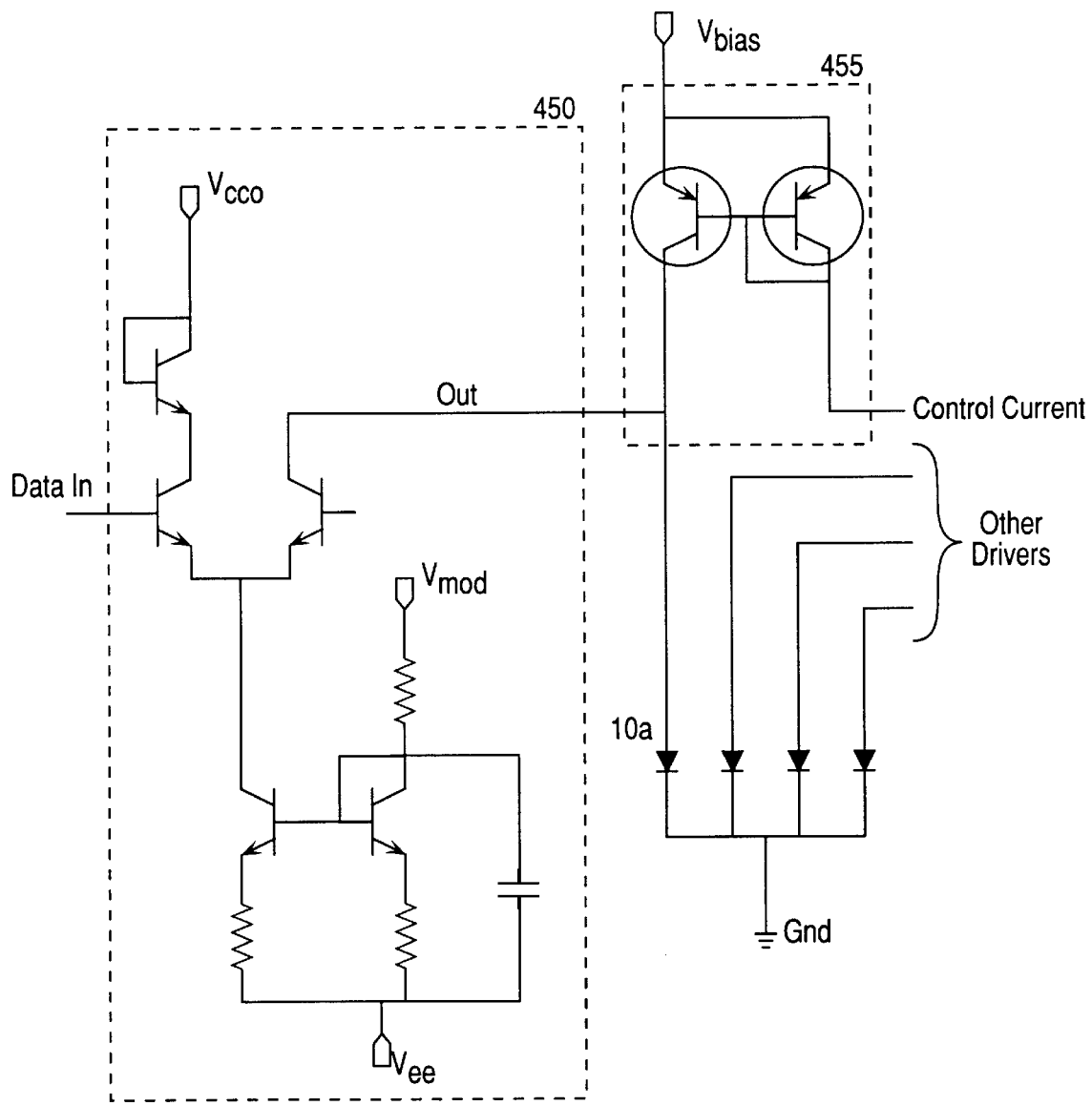
FIGS. 10A is a circuit schematic showing a drive system for the lasers.

FIG. 10A shows a commonly available laser driver circuit 450 in conjunction with a bias circuit 455, connected to one of the lasers, say laser 10$a$, in the laser chip. In this implementation, bias circuit 455 is a current source, where a PNP drive transistor configured as a current mirror acts as the current source. The current source supplies the maximum operating current to the laser. When the laser driver output transistor is on, the current to the laser is decreased by diversion through this transistor. This inverts the optical signal relative to that normally obtained from the laser driver circuit. The off-state laser current is thus the difference between the current source current and the laser driver current. The above-mentioned approach represents a cost effective and efficient way of driving laser diode made on n+ substrates.

Figure 10B:
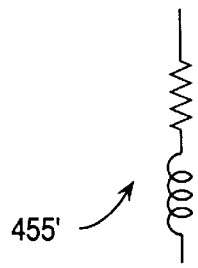
FIG. 10B shows an alternative scheme of electrically driving the laser array.

FIG. 10B shows an alternative approach where the bias circuit, designated 455', includes an inductor and resistor. This approach would be suitable if active components are to be avoided.

With properly chosen bias values, the existing feedback control inputs to the laser driver circuit can be used as well. Not only then does this circuit provide superior drive capability, but it allows the use of existing drivers in this application if desired.

6.0 System Applications

The multi-wavelength laser chip of the present invention provides a number of advantages in WDM system applications. As mentioned above, discrete laser chips can have their individual wavelengths tuned as a function of temperature. However, wavelength monitoring is expensive, and so economies are sometimes taken by monitoring a subset of the wavelengths in a WDM system. Given that the individual lasers in the multi-wavelength laser chip were fabricated under identical conditions and operate under tightly coupled conditions, monitoring the wavelength of only one of the multi-wavelength chip's lasers is likely to be adequate and reliable than monitoring a subset of the discrete lasers' wavelengths.

Figure 11:
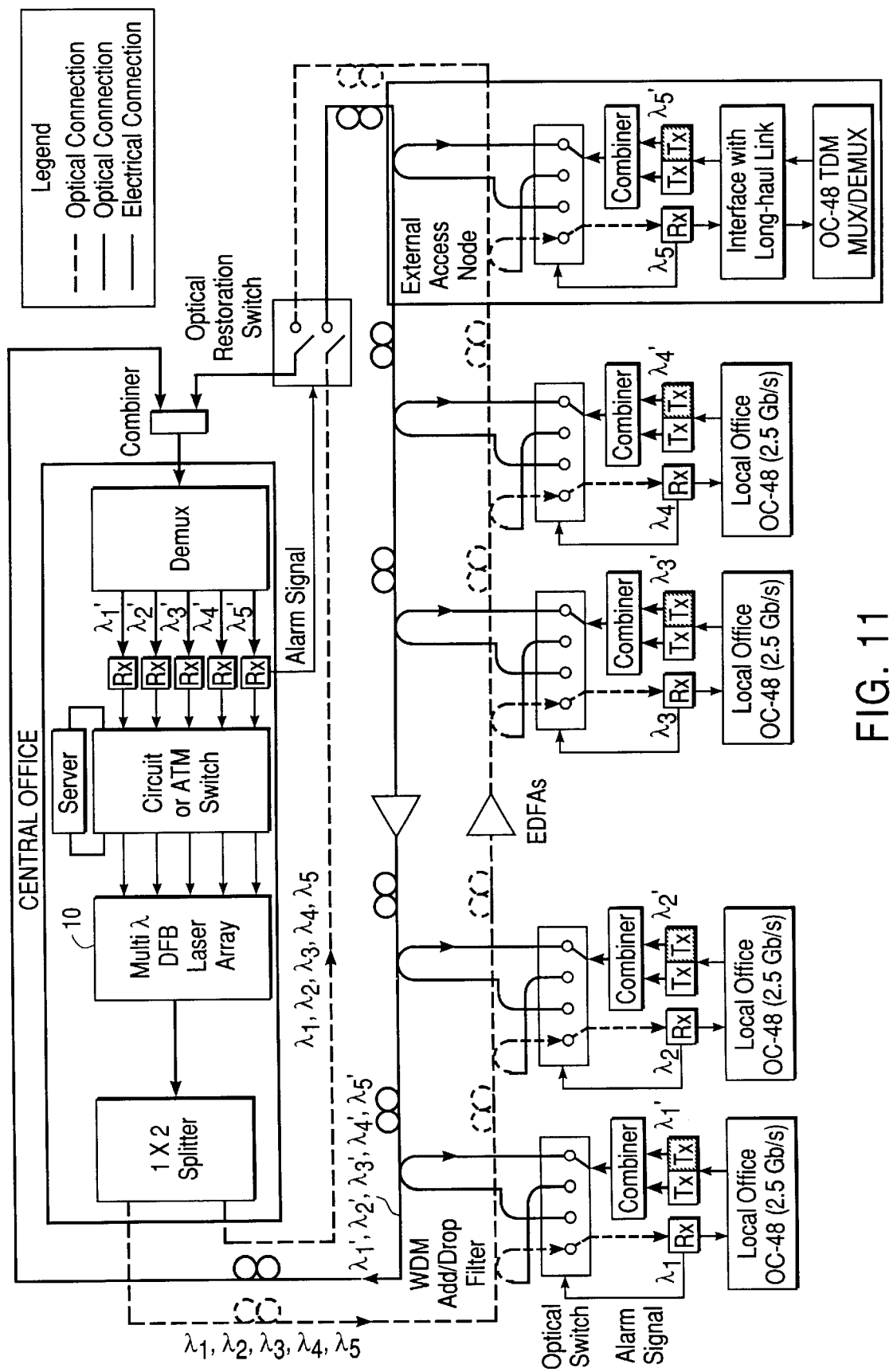
FIG. 11 shows an embodiment of the multi-wavelength laser array module in a metropolitan area telephone network.
Figure 12:
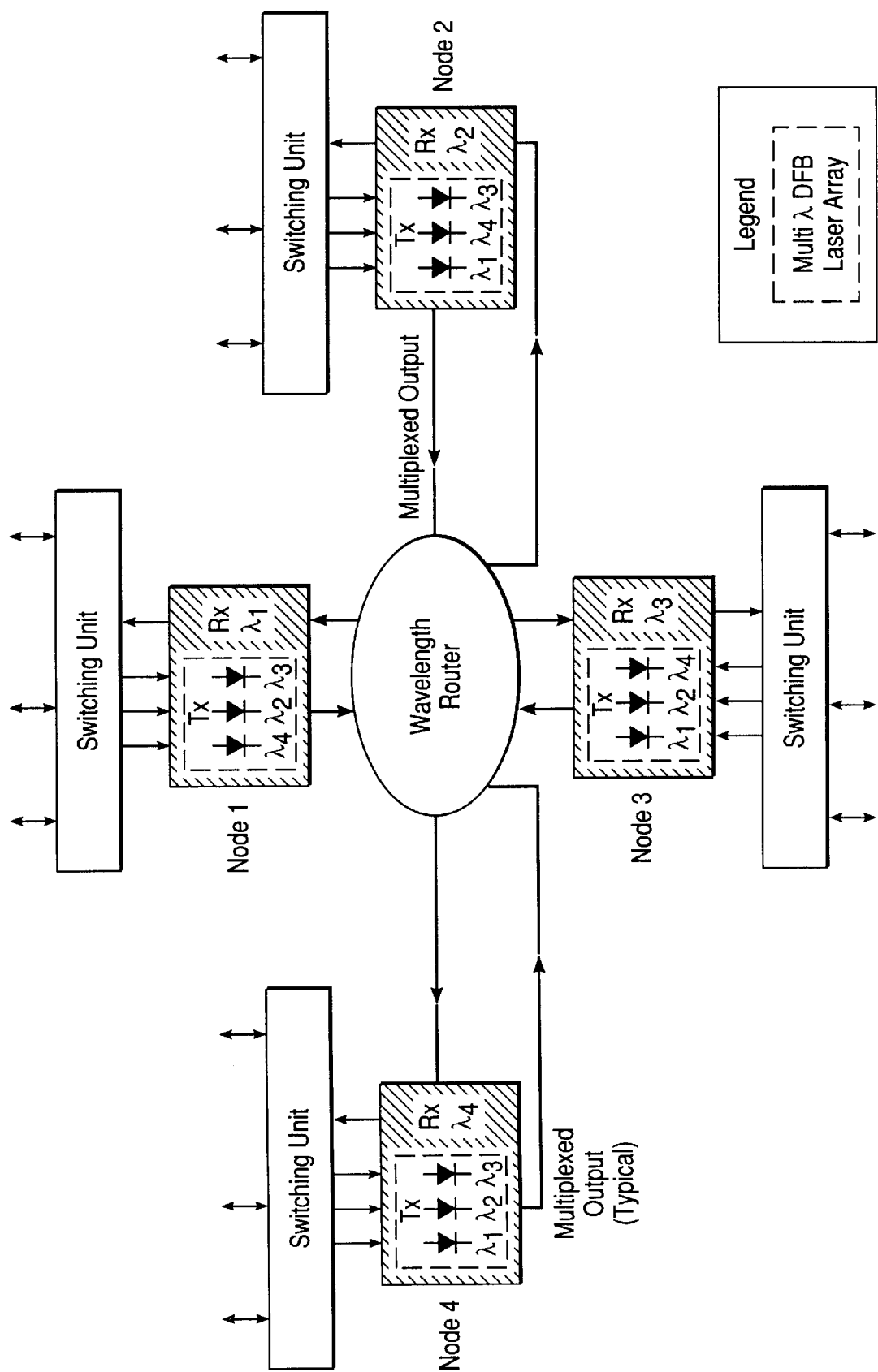
FIG. 12 shows an embodiment of the multi-wavelength laser array module in a local area network.

FIG. 11 shows an embodiment of the multi-wavelength laser array module in a metropolitan area telephone network, while FIG. 12 shows an embodiment of the multi-wavelength laser array module in a local area network. These are only representative of the possible system deployments of the multi-wavelength laser chip of the present invention.

7.0 References

U.S. Pat. Nos. (hereby incorporated by reference):

| Patent Number | Year | Author | Assignee |
| --- | --- | --- | --- |
| U.S. Pat. No. 4,517,280 | 1985 | Okamoto et al. | Sumitomo |
| U.S. Pat. No. 4,748,132 | 1988 | Fukuzawa et al. | Hitachi |
| U.S. Pat. No. 4,846,552 | 1989 | Vieldkamp et al. | U.S. Air Force |
| U.S. Pat. No. 5,413,884 | 1995 | Koch et al. | AT&T |

Foreign Patent Documents (hereby incorporated by reference): 323845410/1991 Japan Non-Patent Publications (hereby incorporated by reference):
1. M. Okai et al., "Novel method to fabricate corrugation for a ¼-shifted distributed feedback laser using a grating photo mask," Applied Physics Letter 55 (5), Jul. 31, 1989, pp. 415–417.
2. C. E. Zah et al., "1.5 mm compressive strained multi-quantum well 20-wavelength distributed feedback laser arrays," Electronics Letters 28, Apr. 23, 1992, pp. 824–826.
3. D. Tennant et al., "Characterization of near-field holography gratings mask for optoelectronics fabricated by electron beam lithography," Journal of Vac. Technology B 10, November/December 1992, pp. 2530–2535.
4. G. Pakulski et al., "Fused silica mask for printing uniform and phase adjusted gratings for distributed feedback lasers," Applied Physics Letter 62 (3), Jan. 18, 1993, pp. 222–224.
5. Howard et al., IEEE Transactions of Electron Devices ED-28 (11) 1981 pp. 1378–1381.

8.0 Conclusion

In conclusion, it can be seen that the present invention provides elegant techniques for reducing the manufacturing cost of multi-wavelength semiconductor laser chips and modules. The invention provides these benefits generally within the bounds of known semiconductor processing technology. The use of a phase mask with normal illumination provides great flexibility in the grating configurations, while allowing extremely fine features to be produced.

While the above is a complete description of specific embodiments of the invention, various modifications, alternative constructions, and equivalents may be used. Therefore, the above description should not be taken as limiting the scope of the invention as defined by the claims.

What is claimed is:

1. A high power unstable resonator laser including a curved grating in combination with a laser diode having curved facets, the curved grating fabricated by a method comprising:

providing a phase mask having a corresponding mask grating structure with features corresponding to the desired device grating structure but characterized by one or more pitch values, each pitch value of the mask grating structure being twice the corresponding pitch value of the desired device grating structure;

the features of the mask grating structure being defined by alternating regions having alternating first and second optical thicknesses;

providing a substrate having at least portions of the semiconductor device formed therein, said substrate being covered with a photoresist material;

disposing the phase mask proximate or in contact with the substrate;

illuminating the phase mask with normally incident light of a particular wavelength so as to expose the photoresist on the substrate;

the particular wavelength being such that light of the particular wavelength traveling through one of the alternating regions of the phase mask and light traveling through an adjacent one of the alternating regions of the phase mask are 180 degrees out of phase;

whereupon the light encountering the photoresist is characterized by an intensity distribution having pitch values that are half the corresponding pitch values of the mask grating features, which intensity distribution corresponds to the desired device grating structure;

developing the photoresist; and etching the substrate to impose the desired device grating structure on the substrate.

2. A vertically focused laser for launching light into a remote optical fiber comprising a curved grating in combination with a laser diode, the curved grating fabricated according to a method comprising:

providing a phase mask having a corresponding mask grating structure with features corresponding to the desired device grating structure but characterized by one or more pitch values, each pitch value of the mask grating structure being twice the corresponding pitch value of the desired device grating structure;

the features of the mask grating structure being defined by alternating regions having alternating first and second optical thicknesses;

providing a substrate having at least portions of the semiconductor device formed therein, said substrate being covered with a photoresist material;

disposing the phase mask proximate or in contact with the substrate;

illuminating the phase mask with normally incident light of a particular wavelength so as to expose the photoresist on the substrate;

the particular wavelength being such that light of the particular wavelength traveling through one of the alternating regions of the phase mask and light traveling through an adjacent one of the alternating regions of the phase mask are 180 degrees out of phase;

whereupon the light encountering the photoresist is characterized by an intensity distribution having pitch values that are half the corresponding pitch values of the mask grating features, which intensity distribution corresponds to the desired device grating structure;

developing the photoresist; and etching the substrate to impose the desired device grating structure on the substrate.

3. A laser diode chip comprising:

a semiconductor substrate;

a multi-layer laser structure formed on said substrate, said laser structure bounded by an upper surface having a first and second spaced trenches defining a ridge waveguide therebetween, said ridge waveguide extending along a direction of light propagation; and first and second metal shoulders formed on said outer surface at locations proximate said trenches and separated from said ridge waveguide by said trenches, said shoulders extending above said top surface so as to protect said ridge waveguide.

4. The laser diode chip of claim 3 wherein said laser structure includes a grating disposed below said ridge waveguide, said grating being disposed in a plane parallel to said upper surface and having grating lines extending in a direction perpendicular to said direction of light propagation.

5. The laser diode chip of claim 4 wherein said laser grating structure includes a phase shift region corresponding to half the grating pitch.

6. The laser diode chip of claim 4, and further comprising an additional laser structure formed on said substrate, said additional laser structure including an additional ridge waveguide and an additional grating disposed below said additional ridge waveguide, said additional grating having a different pitch than said first-mentioned grating.

7. A laser chip module comprising:

a housing having a plurality of pins for communicating signals from outside said housing to within said housing;

a dielectric substrate mounted in said housing, the substrate having an upper surface and a metallized lower surface;

a laser chip mounted to said upper surface of said substrate;

first and second conductive signal lines on said upper surface of said substrate, said signal lines extending from particular first and second input pins to respective locations at or near said laser chip;

the substrate being formed with metallized via holes electrically connected to said metallized lower surface, said via holes forming a pattern such that each of said signal lines has a plurality of via holes on either side and at least some of said via holes are located between said signal lines; and metal structures located above said substrate and electrically connected to said metallized lower surface by said via holes.

8. The laser chip module of claim 7 wherein said transmission lines are of constant width.

9. The laser chip module of claim 7 wherein said metal structures include metallized traces on said substrate and contacting said via holes.

10. The laser chip module of claim 8 wherein said metallized traces are of constant width.

11. The laser chip module of claim 8 wherein at least one of said metallized traces is tapered.

12. The laser chip module of claim 7 wherein:

said pattern of via holes include pairs of via holes distributed along each of said signal lines; and said metal structures include wire arches extending from respective via holes on one side of said signal lines to respective via holes on the other side of aid signal holes.

13. The laser chip module of claim 7 wherein the number of laser diodes is eight or higher.

* * * * *